United States Patent
Fackenthal et al.

(10) Patent No.: US 11,301,320 B2
(45) Date of Patent: Apr. 12, 2022

(54) ERASURE DECODING FOR A MEMORY DEVICE

(71) Applicant: Micron Technology, Inc., Boise, ID (US)

(72) Inventors: Richard E. Fackenthal, Carmichael, CA (US); Angelo Visconti, Appiano Gentile (IT)

(73) Assignee: Micron Technology, Inc., Boise, ID (US)

( * ) Notice: Subject to any disclaimer, the term of this patent is extended or adjusted under 35 U.S.C. 154(b) by 180 days.

(21) Appl. No.: 16/840,286

(22) Filed: Apr. 3, 2020

(65) Prior Publication Data

US 2021/0311824 A1 Oct. 7, 2021

(51) Int. Cl.
*G06F 11/10* (2006.01)
*G06F 13/28* (2006.01)
*G06F 11/30* (2006.01)
*G06F 11/16* (2006.01)
*G11C 11/22* (2006.01)
*G11C 11/4091* (2006.01)

(52) U.S. Cl.
CPC ........ *G06F 11/1068* (2013.01); *G11C 11/221* (2013.01); *G11C 11/2259* (2013.01); *G11C 11/2273* (2013.01); *G11C 11/4091* (2013.01)

(58) Field of Classification Search
CPC ............ G11C 11/2259; G11C 11/2273; G11C 11/4091; G11C 11/221; G06F 11/1068
See application file for complete search history.

(56) References Cited

U.S. PATENT DOCUMENTS

| | | | | |
|---|---|---|---|---|
| 7,283,398 | B1 * | 10/2007 | He | G11C 16/0466 365/185.02 |
| 8,504,893 | B1 * | 8/2013 | Bueb | H03M 13/29 714/758 |

(Continued)

FOREIGN PATENT DOCUMENTS

KR 20180123393 A 11/2018

OTHER PUBLICATIONS

U.S. Appl. No. 16/441,722, by Visconti et al., filed Jun. 14, 2019 (89 pages).

(Continued)

*Primary Examiner* — Guy J Lamarre
(74) *Attorney, Agent, or Firm* — Holland & Hart LLP

(57) ABSTRACT

Methods, systems, and devices for erasure decoding for a memory device are described. In accordance with the described techniques, a memory device may be configured to identify conditions associated with an erasure, a possible erasure, or an otherwise indeterminate logic state (e.g., of a memory cell, of an information position of a codeword). Such an identification may be used to enhance aspects of error handling operations, including those that may be performed at the memory device or a host device (e.g., error handling operations performed at a memory controller external to the memory device). For example, error handling operations may be performed using speculative codewords, where information positions associated with an indeterminate or unassigned logic state are assigned with a respective assumed logic state, which may extend a capability of error detection or error correction compared to handling errors with unknown positions.

25 Claims, 6 Drawing Sheets

(56) References Cited

U.S. PATENT DOCUMENTS

| | | | |
|---|---|---|---|
| 8,694,859 | B2 | 4/2014 | Shalvi et al. |
| 8,977,929 | B2 | 3/2015 | Thiruvengadam et al. |
| 9,583,183 | B2 | 2/2017 | Fainzilber et al. |
| 9,589,655 | B1 | 3/2017 | Kim et al. |
| 9,734,903 | B2 * | 8/2017 | Zamir ................ G11C 16/3431 |
| 10,572,338 | B2 * | 2/2020 | Parthasarathy ..... G11C 11/5642 |
| 2011/0216588 | A1 * | 9/2011 | Kim ....................... G11C 16/04 365/185.03 |
| 2012/0051134 | A1 * | 3/2012 | Shiga .................. G11C 29/025 365/185.11 |
| 2014/0153338 | A1 * | 6/2014 | Byeon ................... G11C 16/28 365/185.21 |
| 2015/0309869 | A1 | 10/2015 | Mittelholzer et al. |
| 2017/0352397 | A1 | 12/2017 | Guo et al. |
| 2019/0130960 | A1 * | 5/2019 | Kim ....................... G06F 11/00 |

OTHER PUBLICATIONS

Taiwan Intellectual Property Office, "Office Action," issued in connection with ROC (Taiwan) Patent Application No. 109116783, dated Jul. 30, 2021 (5 pages).

ISA/KR, International Search Report and written Opinion of the International Searching Authority, Int'l Appl. No. PCT/US2020/032100, dated Aug. 27, 2020, Korean Intellectual Property Office, Seo-gu, Daejeon, Republic of Korea, 11 pgs.

* cited by examiner

ERASURE DECODING FOR A MEMORY DEVICE

BACKGROUND

The following relates generally to a system that includes at least one memory device and more specifically to erasure decoding for a memory device.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

Enhancements in data integrity such as error detection or correction procedures may be desired to improve memory performance.

DETAILED DESCRIPTION

Figure 1:
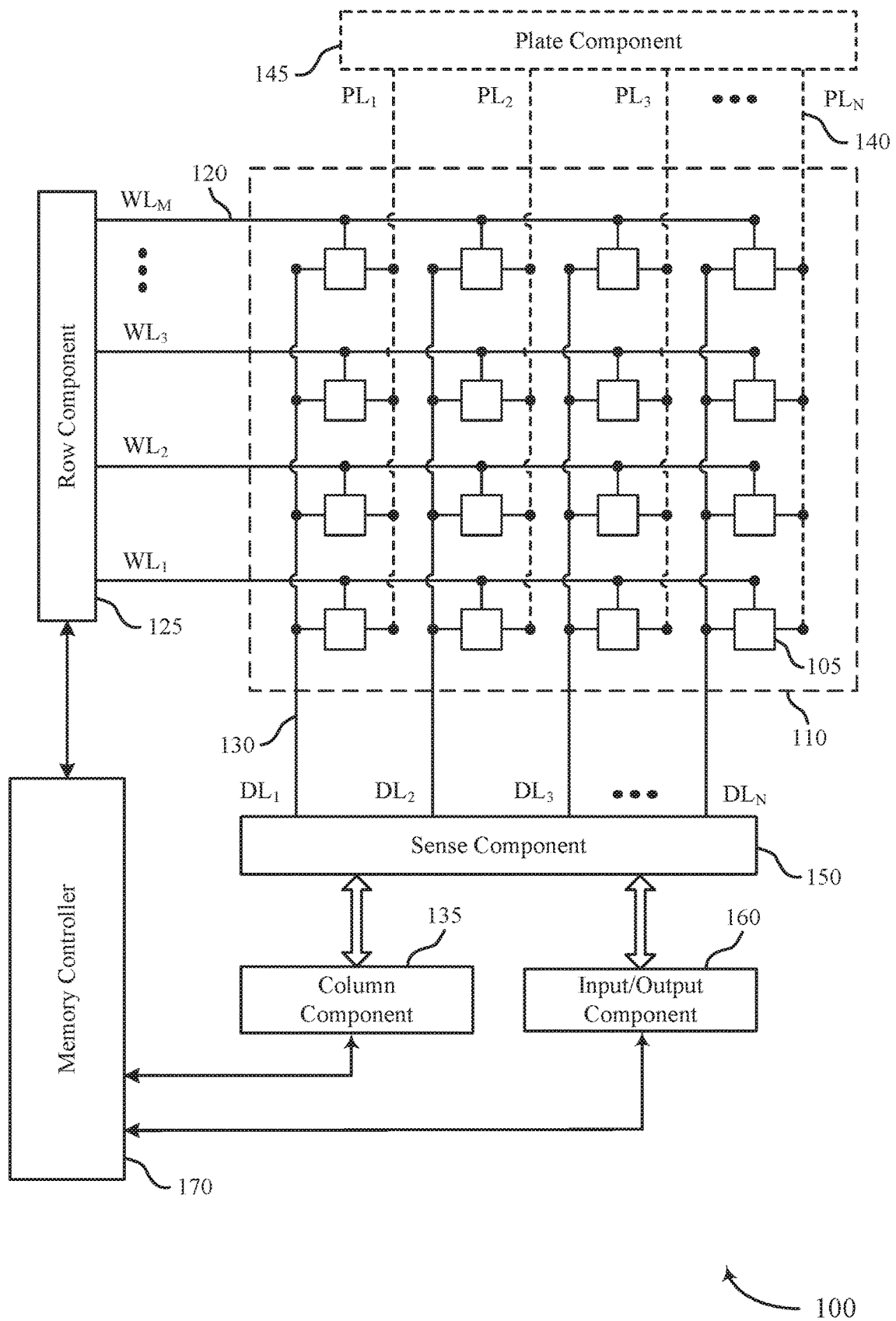
FIG. 1 illustrates an example of a memory device that supports erasure decoding in accordance with examples as disclosed herein.

In some memory devices, erasure or other behavior may result in a condition where an information state (e.g., logic state) written to or stored by a memory cell may be indeterminate (e.g., in a subsequent access operation). For example, in some circumstances, a memory device may be unable to distinguish whether a memory cell stores one logic state or another whether a memory cell stores a logic 1 or a logic 0), or a memory device may read one logic state when reading a memory cell despite a different logic state being written to the memory cell (e.g., detecting a logic 0 during a read operation on a memory cell despite that memory cell being written with a logic 1). In some examples, a memory cell having an indeterminate logic state may result in an error of a corresponding codeword that requires correction (e.g., by an error-correcting code (ECC) or ECC engine), or may result in a quantity of errors of a corresponding codeword exceeding an error correction capability (e.g., of the memory device, of a host device coupled with the memory device). Conditions such as these may degrade a performance of the memory device, or a host device using the memory device for information storage, or may cause a failure of an operation of the memory device or the host device.

In accordance with examples as disclosed herein, a memory device may be configured to identify memory cells, or information positions of corresponding codewords generated during an access operation, that are associated with an erasure, conditions indicative of a possible erasure, or conditions otherwise associated with an indeterminate information state. In some examples, a memory device may be configured to identify conditions indicative of charge leakage (e.g., charge leakage via a memory cell, charge leakage via an access line associated with an access operation), which may be associated with a higher likelihood that a memory cell is sensed as storing a particular logic state (e.g., degrading or eliminating a read margin associated with reading a logic state). In some examples, a memory device may be configured to identify that a signal associated with reading a memory cell is within a range between a first threshold corresponding to a first information state (e.g., a signal threshold indicating a logic 0) and a second threshold corresponding to a second information state (e.g., signal threshold indicating a logic 1), and the signal being within such a range may indicate an uncertainty as to whether the memory cell stored the first information state or the second information state.

Identifying conditions associated with an indeterminate information state may enhance aspects of error detection or error correction operations, including those that may be performed at a memory device or a host device (e.g., error correction operations performed at a memory controller external to a memory device). For example, a memory device may identify one or more memory cells, one or more access lines, or one or more information positions of a codeword, as being associated with an indeterminate information state. A corresponding codeword (e.g., as generated during a read operation) may include some information positions having detected or determinate information states (e.g., a logic 0 or logic 1) and some information positions having an indeterminate information state or otherwise unassigned information state (e.g., a logic X, a null logic state). An error detection operation or an error correction operation in accordance with the disclosed techniques may be performed on one or more codewords (e.g., speculative codewords) where the information positions associated with an indeterminate or unassigned logic state are replaced or assigned with a respective assumed information state (e.g., replacing a logic X with a logic 0, replacing a logic X with a logic 1). By identifying information positions for which to assign such assumed information states, the capability of an error detection or an error correction to handle indeterminate states, or combinations of indeterminate states with other error conditions (e.g., errors in sensed information states at unknown memory cells or locations of a codeword), may be improved.

Figure 2:
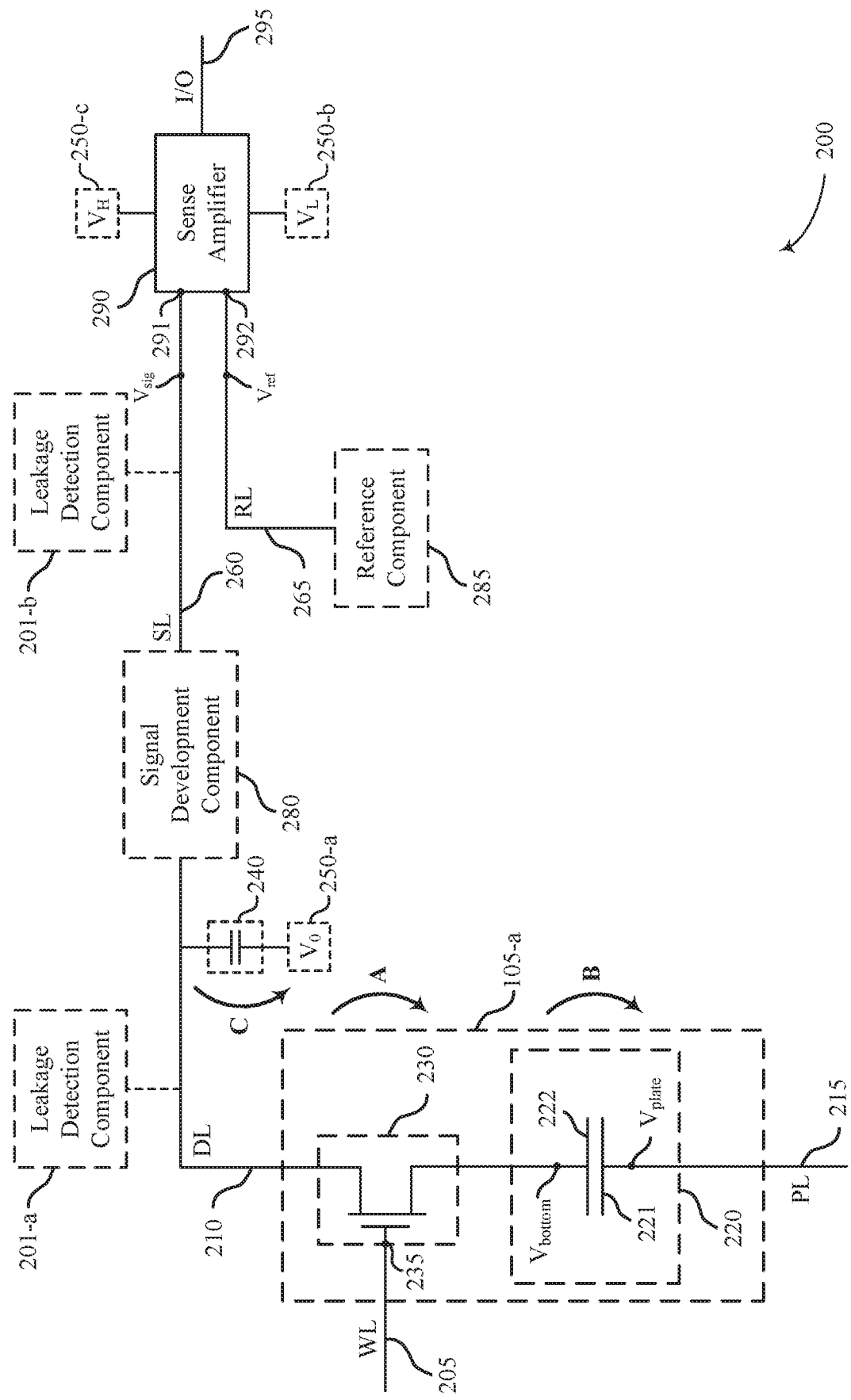
FIG. 2 illustrates an example circuit that supports erasure decoding for a memo device in accordance with examples as disclosed herein.
Figure 3:
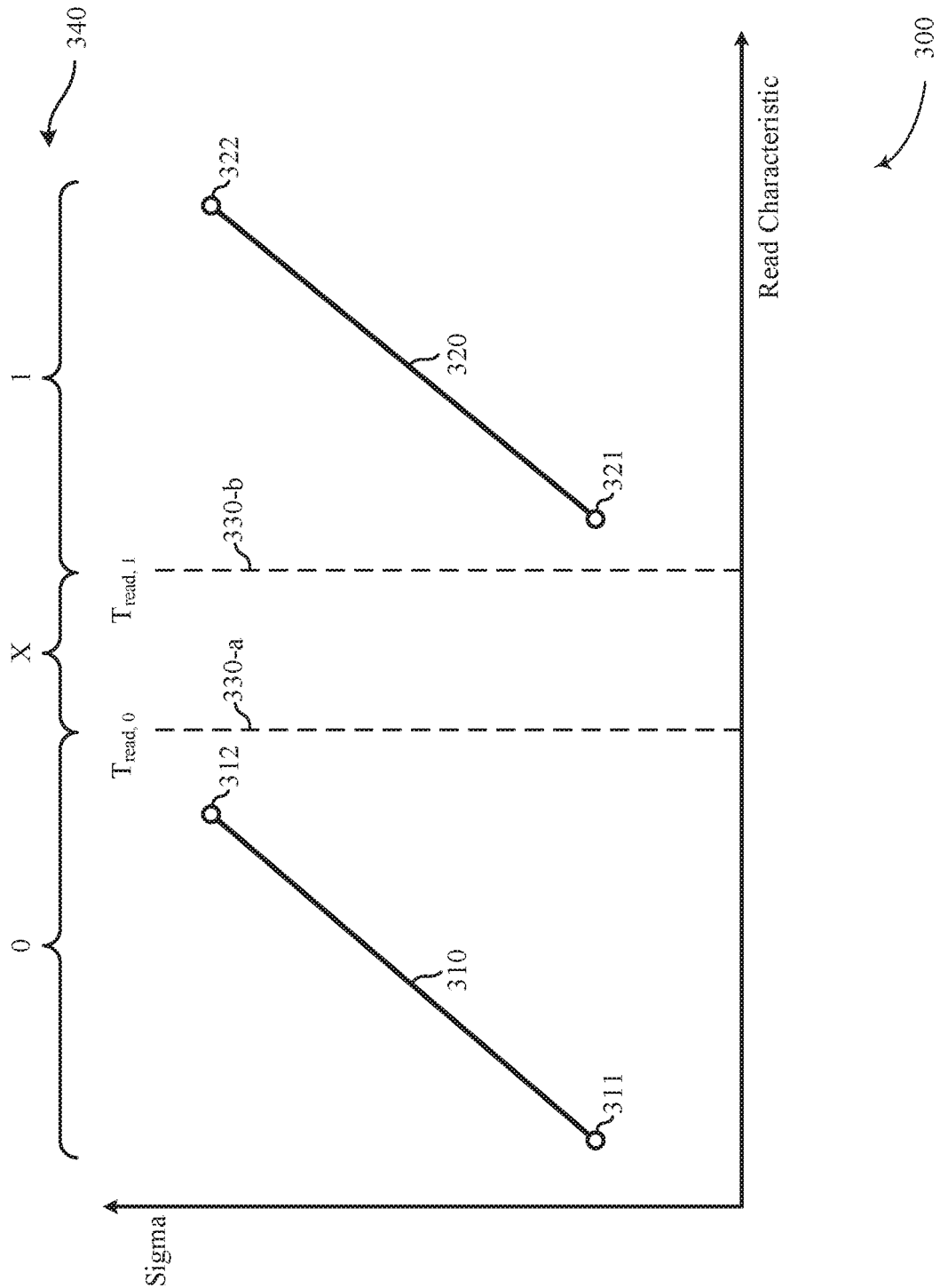
FIG. 3 illustrates a plot including distributions of a read characteristic associated with different information states that may support erasure decoding for a memory device in accordance with examples as disclosed herein.

Features of the disclosure are initially described in the context of a memory device, circuitry, and memory cell characteristics with reference to FIGS. 1-3. Features of the disclosure are further described in the context of an example of an erasure decoding method with reference to FIG. 4. These and other features of the disclosure are further illustrated by and described with reference to apparatus diagrams and flowcharts that relate to erasure decoding for a memory device as described with references to FIGS. 5-6.

FIG. 1 illustrates an example of a memory device 100 that supports erasure decoding in accordance with examples as disclosed herein. The memory device 100 may also be referred to as an electronic memory apparatus. The memory device 100 may include memory cells 105 that are programmable to store different logic states. In some cases, a memory cell 105 may be programmable to store two logic states, denoted a logic 0 and a logic 1. In some cases, a memory cell 105 may be programmable to store more than two logic states. In various examples, the memory cells 105 may include a capacitive storage element, a ferroelectric storage element, a material memory element, a resistive memory element, a thresholding memory element, a phase change memory element, or other types of storage elements. The set of memory cells 105 may be part of a memory section 110 of the memory device 100 (e.g., including an array of memory cells 105), where, in some examples, a memory section 110 may refer to a contiguous tile of memory cells 105 (e.g., a contiguous set of elements of a semiconductor chip).

In some examples, a memory cell 105 may store an electric charge representative of the programmable logic states (e.g., storing charge in a capacitor, capacitive memory element, capacitive storage element). In one example, a charged and uncharged capacitor may represent two logic states, respectively. In another example, a positively charged (e.g., a first polarity, a positive polarity) and negatively charged (e.g., a second polarity, a negative polarity) capacitor may represent two logic states, respectively. DRAM or FeRAM architectures may use such designs, and the capacitor employed may include a dielectric material with linear or para-electric polarization properties as an insulator. In some examples, different levels of charge of a capacitor may represent different logic states, which, in some examples, may support more than two logic states in a respective memory cell 105. In some examples, such as FeRAM architectures, a memory cell 105 may include a ferroelectric capacitor having a ferroelectric material as an insulating (e.g., non-conductive) layer between terminals of the capacitor. Different levels or polarities of polarization of a ferroelectric capacitor may represent different logic states (e.g., supporting two or more logic states in a respective memory cell 105).

In some examples, a memory cell 105 may include or otherwise be associated with a configurable material, which may be referred to as a material memory element, a material storage element, a material portion, and others. The configurable material may have one or more variable and configurable characteristics or properties (e.g., material states) that are representative of (e.g., correspond to) different logic states. For example, a configurable material may take different forms, different atomic configurations, different degrees of crystallinity, different atomic distributions, or otherwise maintain different characteristics that may be leveraged to represent one logic state or another. In some examples, such characteristics may be associated with different electrical resistances, different threshold voltages, or other properties that are detectable or distinguishable during a read operation to identify a logic state written to or stored by the configurable material.

In some cases, a configurable material of a memory cell 105 may be associated with a threshold voltage. For example, electrical current may flow through the configurable material when a voltage greater than the threshold voltage is applied across the memory cell 105, and electrical current may not flow through the configurable material, or may flow through the configurable material at a rate below some level (e.g., according to a leakage rate), when a voltage less than the threshold voltage is applied across the memory cell 105. Thus, a voltage applied to memory cells 105 may result in different current flow, or different perceived resistance, or a change in resistance (e.g., a thresholding or switching event) depending on whether a configurable material portion of the memory cell 105 was mitten with one logic state or another. Accordingly, the magnitude of current, or other characteristic (e.g., thresholding behavior, resistance breakdown behavior, snapback behavior) associated with the current that results from applying a read voltage to the memory cell 105, may be used to determine a logic state written to or stored by memory cell 105.

In the example of memory device 100, each row of memory cells 105 of the memory section 110 may be coupled with one of a set of first access lines 120 (e.g., a word line (WL), such as one of $WL_1$ through $WL_M$, a selection line), and each column of memory cells 105 may be coupled with one of a set of second access lines 130 (e.g., a digit line (DL), such as one of $DL_1$ through $DL_N$). In general, one memory cell 105 may be located at the intersection of (e.g., coupled with, coupled between) an access line 120 and an access line 130. This intersection may be referred to as an address of a memory cell 105. A target or selected memory cell 105 may be a memory cell 105 located at the intersection of an energized or otherwise selected access line 120 and an energized or otherwise selected access line 130. In other words, an access line 120 and an access line 130 may be energized or otherwise selected to access (e.g., read, write, rewrite, refresh) a memory cell 105 at their intersection. Other memory cells 105 that are in electronic communication with (e.g., connected to) the same access line 120 or 130 may be referred to as untargeted or non-selected memory cells 105.

In some architectures, the logic storing component (e.g., a capacitive storage element, a ferroelectric storage element, a material storage element) of a memory cell 105 may be electrically isolated (e.g., selectively isolated) from a second access line 130 by a cell selection component, which, in some examples, may be referred to as a switching component or a selector device of or otherwise associated with the memory cell 105. A first access line 120 may be coupled with the cell selection component (e.g., via a control node or terminal of the cell selection component), and may control the cell selection component of the memory cell 105. For example, the cell selection component may be a transistor and the first access line 120 may be coupled with a gate of the transistor (e.g., where a gate node of the transistor may be a control node of the transistor). Activating the first access line 120 of a memory cell 105 may result in an electrical connection or closed circuit between the logic storing component of the memory cell 105 and its corresponding second access line 130. The second access line 130 may then be accessed to read or write the memory cell 105.

In some examples, memory cells 105 of the memory section 110 may also be coupled with one of a plurality of third access lines 140 (e.g., a plate line (PL), such as one of PL through PLN). Although illustrated as separate lines, in some examples, the plurality of third access lines 140 may represent or be otherwise functionally equivalent with a common plate line, a common plate, or other common node of the memory section 110 (e.g., a node common to each of the memory cells 105 in the memory section 110), or other common node of the memory device 100. In some examples, the plurality of third access lines 140 may couple memory cells 105 with one or more voltage sources for various sensing or writing operations including those described herein. For example, when a memory cell 105 employs a capacitor for storing a logic state, a second access line 130 may provide access to a first terminal or a first plate of the capacitor, and a third access line 140 may provide access to a second terminal or a second plate of the capacitor (e.g., a terminal associated with an opposite plate of the capacitor as opposed to the first terminal of the capacitor, a terminal otherwise on the opposite side of a capacitance from the first terminal of the capacitor).

The plurality of third access lines 140 may be coupled with a plate component 145, which may control various operations such as activating one or more of the plurality of third access lines 140, or selectively coupling one or more of the plurality of third access lines 140 with a voltage source or other circuit element. Although the plurality of third access lines 140 of the memory device 100 are shown as substantially parallel with the plurality of second access lines 130, in other examples, a plurality of third access lines 140 may be substantially parallel with the plurality of first access lines 120, or in any other configuration (e.g., a common planar conductor, a common plate layer).

Access operations such as reading, writing, rewriting, and refreshing may be performed on a memory cell 105 by activating or selecting a first access line 120, a second access line 130, or a third access line 140 coupled with the memory cell 105, which may include applying a voltage, a charge, or a current to the respective access line. Access lines 120, 130, and 140 may be made of conductive materials, such as metals (e.g., copper (Cu), silver (Ag), aluminum (Al), gold (Au), tungsten (W), titanium (Ti)), metal alloys, carbon, or other conductive or semi-conductive materials, alloys, or compounds. Upon selecting a memory cell 105, a resulting signal may be used to determine the logic state stored by the memory cell 105. For example, a memory cell 105 with a capacitive memory element storing a logic state may be selected, and the resulting flow of charge via an access line or resulting voltage of an access line may be detected to determine the programmed logic state stored by the memory cell 105.

Accessing memory cells 105 may be controlled through a row component 125 (e.g., a row decoder), a column component 135 (e.g., a column decoder), or a plate component 145 (e.g., a plate driver), or a combination thereof. For example, a row component 125 may receive a row address from the memory controller 170 and activate the appropriate first access line 120 based on the received row address. Similarly, a column component 135 may receive a column address from the memory controller 170 and activate the appropriate second access line 130. Thus, in some examples, a memory cell 105 may be accessed by activating a first access line 120 and a second access line 130. In some examples, such access operations may be accompanied by a plate component 145 biasing one or more of the third access lines 140 (e.g., biasing one of the third access lines 140 of the memory section 110, biasing all of the third access 140 of the memory section, biasing a common plate line of the memory section 110 or the memory device 100, biasing a common node of the memory section 110 or the memory device 100).

In some examples, the memory controller 170 may control operations (e.g., read operations, write operations, rewrite operations, refresh operations) of memory cells 105 through the various components (e.g., row component 125, column component 135, plate component 145, sense component 150). In some cases, one or more of the row component 125, the column component 135, the plate component 145, and the sense component 150 may be co-located or otherwise included with the memory controller 170. The memory controller 170 may generate row and column address signals to activate a desired access line 120 and access line 130. The memory controller 170 may also generate or control various voltages or currents used during the operation of memory device 100).

In general, the amplitude, shape, or duration of an applied voltage, current, or charge may be adjusted or varied, and may be different for the various operations discussed for operating the memory device 100. Further, one, multiple, or all memory cells 105 within memory, device 100 may be accessed simultaneously. For example, each of the memory cells 105 that share a common access line 120, or some subset of the memory cells 105 that share a common access line 120 (e.g., a common cell selection line), may be accessed simultaneously (e.g., according to a memory row access arrangement, according to a "page" access arrangement, according to a set of access lines 130 or columns that may be accessed or sensed simultaneously). In another example, multiple or all memory cells 105 of memory device 100 may be accessed simultaneously during a reset operation in which all memory cells 105, or a group of memory cells 105 (e.g., the memory cells 105 of a memory section 110), are set to a single logic state.

A memory cell 105 may be read (e.g., sensed) by a sense component 150 when the memory cell 105 is accessed (e.g., in cooperation with the memory controller 170) to determine a logic state written to or stored by the memory cell 105. For example, the sense component 150 may be configured to sense a current or charge transfer through or from the memory cell 105, or a voltage resulting from coupling the memory cell 105 with the sense component 150 or other intervening component (e.g., a signal development component between the memory cell 105 and the sense component 150), responsive to a read operation. The sense component 150 may provide an output signal indicative of the logic state read from the memory cell 105 to one or more components (e.g., to the column component 135, the input/output component 160, the memory controller 170). In various memory devices 100, a sense component 150 may be shared among a set of memory sections 110 (e.g., having subcomponents common to all of the set of memory sections 110, having subcomponents dedicated to respective ones of the set of memory sections 110), or a sense component 150 may be dedicated to one memory section 110 of a set of memory sections 110.

In some examples, during or after accessing a memory cell 105, a storage element of memory cell 105 may discharge, or otherwise permit electrical charge or current to flow via its corresponding access lines 120, 130, or 140. Such charge or current may result from biasing, or applying a voltage, to the memory cell 105 from one or more voltage sources or supplies (not shown) of the memory device 100, where such voltage sources or supplies may be part of a row component 125, a column component 135, a plate component 145, a sense component 150, a memory controller 170, or some other component (e.g., a biasing component). In some examples, charge sharing between a selected memory cell 105 and an access line 130 may cause a change in the voltage of the access line 130, which the sense component 150 may compare to a reference voltage to determine the stored logic state of the memory cell 105.

A sense component 150 may include various switching components, selection components, transistors, amplifiers, capacitors, resistors, or voltage sources to detect or amplify a difference in sensing signals (e.g., a difference between a read voltage and a reference voltage, a difference between a read current and a reference current, a difference between a read charge and a reference charge), which, in some examples, may be referred to as latching. In some examples, a sense component 150 may include a collection of components (e.g., circuit elements) that are repeated for each of a set of access lines 130 connected to the sense component 150. For example, a sense component 150 may include a separate sensing circuit (e.g., a separate or duplicated sense amplifier, a separate or duplicated signal development component) for each of a set of access lines 130 coupled with the sense component 150, such that a logic state may be separately detected for a respective memory cell 105 coupled with a respective one of the set of access lines 130. In some examples, the detected logic state of a memory cell 105 may be output through a column component 135 or an input/output component 160 as an output.

In some examples, a reference signal source (e.g., a reference component) or generated reference signal may be shared between components of the memory device 100 (e.g., shared among one or more sense components 150, shared among separate sensing circuits of a sense component 150, shared among access lines 120, 130, or 140 of a memory section 110). In some examples, a sense component 150 may be part of a column component 135 or a row component 125. In some examples, a sense component 150 may be connected to or otherwise in electronic communication with a column component 135 or a row component 125.

In some memory architectures, accessing a memory cell 105 may degrade or destroy the stored logic state, and rewrite or refresh operations may be performed to return the stored logic state to memory cell 105. In DRAM or FeRAM, for example, a capacitor of a memory cell 105 may be partially or completely discharged during a sense operation, thereby corrupting the logic state that was stored in the memory cell 105. Thus, in some examples, the logic state stored in a memory cell 105 may be rewritten after an access operation. Further, activating a single access line 120, 130, or 140 may result in the discharge of all memory cells 105 coupled with the activated access line 120, 130, or 140. Thus, several or all memory cells 105 coupled with an access line 120, 130, or 140 associated with an access operation (e.g., all cells of an accessed row, all cells of an accessed column) may be rewritten after the access operation.

In some examples, reading a memory cell 105 may be non-destructive. That is, the logic state of the memory cell 105 may not need to be rewritten after the memory cell 105 is read. However, in some examples, refreshing the logic state of the memory cell 105 may or may not be needed in the absence or presence of other access operations. For example, the logic state stored by a memory cell 105 may be refreshed at periodic intervals by applying an appropriate write, rewrite, refresh, or equalization pulse or bias to maintain the stored logic state. Refreshing the memory cell 105 may reduce or eliminate read disturb errors or logic state corruption due to a charge leakage or a change in a material configuration of a memory element over time.

A memory cell 105 may be set, or written, by activating the relevant first access line 120, second access line 130, or third access line 140 (e.g., via a memory controller 170) In other words, a logic state may be stored in a memory cell 105. Row component 125, column component 135, or plate component 145 may accept data, for example, via input/output component 160, to be written to the memory cells 105. In some examples, a write operation may be performed at least in part by a sense component 150, or a write operation may be configured to bypass a sense component 150.

In the case of a capacitive memory element, a memory cell 105 may be written by applying a voltage to or across a capacitor, and then isolating the capacitor (e.g., isolating the capacitor from a voltage source used to write the memory cell 105, floating the capacitor) to store a charge in the capacitor associated with a desired logic state. In the case of ferroelectric memory, a ferroelectric memory element (e.g., a ferroelectric capacitor) of a memory cell 105 may be written by applying a voltage with a magnitude high enough to polarize the ferroelectric memory element (e.g., applying a saturation voltage) with a polarization associated with a desired logic state, and the ferroelectric memory element may be isolated (e.g., floating), or a zero net voltage or bias may be applied across the ferroelectric memory element (e.g., grounding, virtually grounding, or equalizing a voltage across the ferroelectric memory element). In the case of a material memory architecture, a memory cell 105 may be written by applying a current, voltage, or other heating or biasing to a material memory element to configure the material according to a corresponding logic state.

In some examples, erasure or other behavior may result in a condition where an information state (e.g., logic state) written to or stored by a memory cell 105 may be indeterminate (e.g., in a subsequent access operation). For example, in some circumstances, the memory device 100 may be unable to distinguish whether a memory cell 105 stores one logic state or another (e.g., whether a memory cell stores a logic 1 or a logic 0), or the memory device 100 may detect one logic state when reading a memory cell 105 despite a different logic state being written to the memory cell 105 (e.g., detecting a logic 0 during a read operation on a memory cell despite that memory cell being written with a logic 1).

In accordance with examples as disclosed herein, the memory device 100 may be configured to identify various conditions that may be associated with an indeterminate or uncertain information state. For example, the memory device 100 may identify one or more memory cells 105, one or more access lines (e.g., access lines 130), or one or more information positions of a codeword, as being associated with an indeterminate or uncertain information state. A corresponding codeword (e.g., as generated during a read operation) may include some information positions having detected information states (e.g., a logic 0 or logic 1) and some information positions having an indeterminate information state or otherwise unassigned information state (e.g., a logic X, a null logic state). Error handling operations may be performed on codewords where the information positions associated with an indeterminate or unassigned logic state are replaced or assigned with a respective assumed or speculative information state (e.g., replacing a logic X with a logic 0, replacing a logic X with a logic 1), which may improve a capability for handling various errors, among other benefits.

FIG. 2 illustrates an example circuit 200 that supports erasure decoding for a memory device in accordance with examples as disclosed herein. Circuit 200 includes a memory cell 105-a, which may be an example of a memory cell 105 described with reference to FIG. 1. Circuit 200 also includes a sense amplifier 290, which may be a portion of a sense component 150 described with reference to FIG. 1. Circuit 200 may also include a word line 205, a digit line 210, and a plate line 215, which, in some examples, may correspond to a first access line 120, a second access line 130, and a third access line 140, respectively (e.g., of a memory section 110), as described with reference to FIG. 1. In some examples, the plate line 215 may be illustrative of a common plate line, a common plate, or another common node for the memory cell 105-a and another memory cell 105 (not shown) of a same memory section 110. The circuit 200 may also include a reference line 265 used by the sense amplifier 290 to determine a stored logic state of the memory cell 105-a.

As illustrated in FIG. 2, the sense amplifier 290 may include a first node 291 and a second node 292 which, in some examples, may be coupled with different access lines of a circuit (e.g., a signal line 260 and a reference line 265 of the circuit 200, respectively) or, in other examples, may be coupled with a common access line of a different circuit (not shown). In some examples, the first node 291 may be referred to as a signal node, and the second node 292 may be referred to as a reference node. However, other configurations of access lines or reference lines may be used to support the techniques described herein.

The memory cell 105-a may include a logic storage component (e.g., a memory element, a storage element, a memory storage element), such as a capacitor 220 that has a first plate, cell plate 221, and a second plate, cell bottom 222. The cell plate 221 and the cell bottom 222 may be capacitively coupled through a dielectric material positioned between them (e.g., in a DRAM application), or capacitively coupled through a ferroelectric material positioned between them (e.g., in a FeRAM application). The cell plate 221 may be associated with a voltage $V_{plate}$, and cell bottom 222 may be associated with a voltage $V_{bottom}$, as illustrated in the circuit 200. The cell plate 221 may be accessed via the plate line 215 and cell bottom 222 may be accessed via the digit line 210. As described herein, various logic states may be stored by charging, discharging, or polarizing the capacitor 220.

The capacitor 220 may be electrically connected to the digit line 210, and the stored logic state of the capacitor 220 may be read or sensed by operating various elements represented in circuit 200. For example, the memory cell 105-a may also include a cell selection component 230 which, in some examples, may be referred to as a switching component or a selector device coupled with or between an access line (e.g., the digit line 210) and the capacitor 220. In some examples, a cell selection component 230 may be considered to be outside the illustrative boundary of the memory cell 105-a, and the cell selection component 230 may be referred to as a switching component or selector device coupled with or between an access line (e.g., the digit line 210) and the memory cell 105-a.

The capacitor 220 may be selectively coupled with the digit line 210 when the cell selection component 230 is activated (e.g., by way of an activating logical signal), and the capacitor 220 can be selectively isolated from the digit line 210 when the cell selection component 230 is deactivated (e.g., by way of a deactivating logical signal). A logical signal or other selection signal or voltage may be applied to a control node 235 of the cell selection component 230 (e.g., via the word line 205). In other words, the cell selection component 230 may be configured to selectively couple or decouple the capacitor 220 and the digit line 210 based on a logical signal or voltage applied via the word line 205 to the control node 235.

Activating the cell selection component 230 may be referred to as selecting or activating the memory cell 105-a, and deactivating the cell selection component 230 may be referred to as deselecting or deactivating the memory cell 105-a. In some examples, the cell selection component 230 is a transistor and its operation may be controlled by applying an activation voltage to the transistor gate (e.g., a control or selection node or terminal). The voltage for activating the transistor (e.g., the voltage between the transistor gate terminal and the transistor source terminal) may be a voltage greater than the threshold voltage magnitude of the transistor. In some examples, activating the cell selection component 230 may be referred to as selectively coupling the memory cell 105-a with the digit line 210.

Operation of the memory cell 105-a by varying the voltage to cell plate 221 (e.g., via the plate line 215) may be referred to as "moving the cell plate." Biasing the plate line 215 or the digit line 210 may result in a voltage difference (e.g., the voltage of the digit line 210 minus the voltage of the plate line 215) across the capacitor 220. The voltage difference may accompany a change in the stored charge on capacitor 220 (e.g., due to charge sharing between the capacitor 220 and the digit line 210, due to charge sharing between the capacitor 220 and the plate line 215), where the magnitude of the change in stored charge may depend on the initial state of the capacitor 220 (e.g., whether the initial charge or logic state stored a logic 1 or a logic 0). In some schemes, a change in the stored charge of the capacitor 220 may cause a change in the voltage of one or both of the digit line 210 or the signal line 260, which may be used by the sense amplifier 290 to determine the stored logic state of the memory cell 105-a.

The digit line 210 may be coupled with additional memory cells 105 (not shown), and the digit line 210 may have properties that result in a non-negligible intrinsic capacitance 240 (e.g., on the order of picofarads (pF)), which may couple the digit line 210 with a voltage source 250-a. The voltage source 250-a may represent a common ground or virtual ground voltage, or the voltage of an adjacent access line of the circuit 200 (not shown). Although illustrated as a separate element in FIG. 2, the intrinsic capacitance 240 may be associated with properties distributed throughout the digit line 210.

The resulting voltage of the digit line 210 or the signal line 260 after selecting the memory cell 105-a may be compared to a reference (e.g., a voltage of the reference line 265) by the sense amplifier 290 to determine the logic state that was stored in the memory cell 105-a. In some examples, a voltage of the reference line 265 may be provided by a reference component 285. In other examples, the reference component 285 may be omitted and a reference voltage may be provided, for example, by accessing the memory cell 105-a to generate the reference voltage (e.g., in a self-referencing access operation).

In some examples, the circuit 200 may include a signal development component 280, which may be an example of a signal development circuit coupled with or between the memory cell 105-a and the sense amplifier 290. The signal development component 280 may amplify or otherwise convert signals of the digit line 210 prior to a sensing operation. The signal development component 280 may include, for example, a transistor, an amplifier, a cascode, or any other charge or voltage converter or amplifier component. In some examples, the signal development component 280 may include a charge transfer sensing amplifier (CTSA), which may include one or more transistors in a cascode or voltage control configuration.

Although the digit line 210 and the signal line 260 are identified as separate lines, the digit line 210, the signal line 260, and any other lines connecting a memory cell 105 with a sense amplifier 290 may be referred to as a single access line. Constituent portions of such an access line may be identified separately for the purposes of illustrating intervening components and intervening signals in various example configurations.

The sense amplifier 290 may include various transistors or amplifiers to detect, convert, or amplify a difference in signals, which may be referred to as latching. For example, the sense amplifier 290 may include circuit elements that receive and compare a sense signal voltage (e.g., $V_{sig}$) at the first node 291 with a reference signal voltage (e.g., $V_{ref}$) at the second node 292. An output of the sense amplifier may be driven to a higher voltage (e.g., a positive voltage) or a lower voltage (e.g., a negative voltage, a ground voltage) based on the comparison at the sense amplifier 290.

For example, if the first node 291 has a lower voltage than the second node 292, the output of the sense amplifier 290 may be driven to a relatively lower voltage of a first sense amplifier voltage source 250-*b* (e.g., a voltage of $V_L$, second which may be a ground voltage substantially equal to $V_0$ or a negative voltage). A sense component 150 that includes the sense amplifier 290 may latch the output of the sense amplifier 290 to determine the logic state stored in the memory cell 105-*a* (e.g., detecting a logic 0 when the first node 291 has a lower voltage than the second node 292).

If the first node 291 has a higher voltage than the second node 292, the output of the sense amplifier 290 may be driven to the voltage of a second sense amplifier voltage source 250-*c* (e.g., a voltage of $V_H$). A sense component 150 that includes the sense amplifier 290 may latch the output of the sense amplifier 290 to determine the logic state stored in the memory cell 105-*a* (e.g., detecting a logic 1 when the first node 291 has a higher voltage than the second node 292). The latched output of the sense amplifier 290, corresponding to the detected logic state of memory cell 105-*a*, may then be output via one or more input/output (I/Q) lines (e.g., I/O line 295), which may include an output through a column component 135 or an input/output component 160 described with reference to FIG. 1.

To perform a write operation on the memory cell 105-*a*, a voltage may be applied across the capacitor 220 by controlling the voltage of the cell plate 221 (e.g., through the plate line 215) and the cell bottom 222 (e.g., through the digit line 210). For example, to write a logic 0, the cell plate 221 may be taken low (e.g., grounding the plate line 215, virtually grounding the plate line 215, applying a negative voltage to the plate line 215), and the cell bottom 222 may be taken high (e.g., applying a positive voltage to the digit line 210). The opposite process may be performed to write a logic 1, where the cell plate 221 is taken high and the cell bottom 222 is taken low. In some cases, the voltage applied across the capacitor 220 during a write operation may have a magnitude equal to or greater than a saturation voltage of a ferroelectric material in the capacitor 220, such that the capacitor 220 is polarized, and thus maintains a charge even when the magnitude of applied voltage is reduced, or if a zero net voltage is applied across the capacitor 220.

Although the circuit 200 illustrates a set of components relative to a single memory cell 105, various components of the circuit 200 may be duplicated in a memory device 100 to support various operations. For example, to support row access or "page" access operations, a memory device 100 may be configured with multiples of one or more of the sense amplifier 290, the signal line 260, the signal development component 280, the digit line 210, or other components, where the multiples may be configured according to a quantity of memory cells 105 that may be accessed in a row access or "page" access operation (e.g., in a simultaneous operation). In various examples, a set of such multiples may correspond to or otherwise be repeated for each memory section 110 in a memory device 100, or such a set of multiples may be shared among one or more memory sections 110 in a memory device.

In some examples, the sense amplifier 290 may be unable to distinguish whether the memory cell 105-*a* was written with one logic state or another (e.g., whether the memory cell 105-*a* stores a logic 1 or a logic 0), or the sense amplifier 290 may detect one logic state when reading the memory cell 105-*a* despite a different logic state being written to the memory cell 105-*a* (e.g., detecting a logic 0 during a read operation on a memory cell despite that memory cell being written with a logic 1). Such conditions may be associated with an indeterminate information state of the memory cell 105-*a*, and may be related to various conditions such as erasure, charge leakage, information state degradation (e.g., degradation of a logic state, charge state, or material state of the memory cell 105-*a*), or other phenomena.

In some examples, an indeterminate information state of the memory cell 105-*a* may be a result of charge leakage from one portion of the circuit 200 to another. Possible causes of leakage include manufacturing defects, component breakdown (e.g., thin film transistor (TFT) breakdown or leakage), memory cell wear-out mechanisms (e.g., stress-induced leakage current (SILC), breakdown (BD) current), changes in material composition of an element of the circuit 200, or other causes. For example, charge may leak across the cell selection component 230 (e.g., a leakage path "A"), across a dielectric material of the capacitor 220 (e.g., a leakage path "B"), from one access line of the memory device 100 to another (e.g., a leakage path "C" from digit line 210 to another access line or chassis ground). Other examples, not illustrated, may include other leakage paths that permit charge transfer between the memory cell 105-*a* and another component of a memory device 100 that includes the circuit 200, between the digit line 210 and another component of a memory device 100 that includes the circuit 200 (e.g., between the digit line 210 and another digit line 210, not shown), or between the signal line 260 and another component of a memory device 100 that includes the circuit 200 (e.g., between the signal line 260 and another signal line 260, not shown), or various combinations thereof. In various examples, charge leakage may affect the information state of the memory cell 105-*a* itself, or the ability to generate or detect a signal (e.g., a read signal) resulting from accessing the memory cell 105-*a*, either or both of which may be associated with a read operation being unable to determine a logic state that was written to the memory cell 105-*a*.

In some examples of a memory device that support the described techniques for erasure decoding for a memory device, the circuit 200 may include one or more leakage detection components 201 to detect a presence or level of charge leakage (e.g., a transfer of charge between components intended to be electrically isolated), such as one or both of a leakage detection component 201-*a* connected with the digit line 210, or a leakage detection component 201-*b* connected with the signal line 260. A leakage detection component 201 may be configured to detect charge leakage in the circuit 200, such as a leakage or other transfer of charge that is above or otherwise satisfies a threshold (e.g., above a threshold that would indicate normal operation of the circuit 200, an amount of charge leakage that indicates abnormal operation of one or more elements of the circuit 200). Although the leakage detection components 201 are illustrated as being separate components, in some examples, a leakage detection component 201 may be included in a signal development component 280, or included in a sense amplifier 290, and a leakage detection component 201 may be connected with multiple access lines, or connected in series with an access line.

In some examples, a leakage detection component 201 may be configured to detect a charge leakage by identifying a change in voltage (e.g., of an access line, of a memory cell 105), or comparing a voltage to a reference voltage or threshold (e.g., using a sense amplifier, a multi-level cell (MLC) latch, a comparator, or other component of the leakage detection component 201). For example, the leakage detection component 201-*a* may be configured to monitor a voltage of the digit line 210, or the leakage detection component 201-*b* may be configured to monitor a voltage of the signal line 260. In some examples, a leakage detection component 201 may be configured to detect a flow of charge (e.g., under scenarios or conditions where such a flow of charge, or a flow of charge above a threshold, would indicate leakage rather than charge transfer normally associated with an access operation), For example, the leakage detection component 201-*a* may be configured to detect a flow of charge along the digit line 210, or the leakage detection component 201-*b* may be configured to detect a flow of charge along the signal line 260, either of which may correspond to a flow of charge across the signal development component 280. In some examples, detecting a flow of charge may be supported by monitoring a voltage across a shunt resistor configured to convey the flow of charge (e.g., when a leakage detection component 201 is connected in series with an access line or component).

In some examples, a leakage detection component 201 may be configured to detect cell-specific charge leakage (e.g., charge leakage that follows path "A" or "B", which may be specific to the memory cell 105-*a*), which may be distinguishable from other charge leakage that may be common to a set of memory cells 105 that share the digit line 210 (e.g., charge leakage that follows path "C"). In some examples, a leakage detection component 201 may not be configured to distinguish cell-specific charge leakage from other charge leakage associated more generally with an access line (e.g., charge leakage associated with the digit line 210, charge leakage associated with the signal line 260, charge leakage that is common to one or more of a set of memory cells 105).

In some examples, a leakage detection component 201 may be configured to perform a leakage detection operation during, or otherwise based at least in part on an access operation (e.g., of the memory cell 105-*a*), which may include performing a leakage detection operation while the memory cell 105-*a* is selected (e.g., while the cell selection component 230 is activated, while the word line 205 is activated). A leakage detection component 201 may thus be in communication with a memory controller 170, a sense component 150, the sense amplifier 290, or the word line 205, which may support the leakage detection component 201 performing operations during particular portions of an access operation. In some examples, a leakage detection component 201 may be configured to perform a leakage detection operation during, or otherwise based at least in part on a diagnostic mode of a memory device 100, which may or may not be included in or otherwise associated with an access operation.

A leakage detection component 201 may provide information to support identifying the memory cell 105-*a*, or an access line coupled with the memory cell 105-*a* (e.g., digit line 210, signal line 260) as being associated with an indeterminate logic state, or conditions otherwise indicative of a possibly indeterminate logic state. For example, a leakage detection component may include providing an indication of whether leakage was detected (e.g., for a particular memory cell 105, for a particular access line, for a particular memory address) to one or more of a memory controller 170, a sense component 150, the sense amplifier 290, or other components. Such information may, for example, be used to identify information positions of a codeword (e.g., generated in a read operation) having indeterminate or unassigned information states, which may be subsequently assigned with one or more assumed or speculative information states to support various error handling operations in accordance with the techniques disclosed herein.

In some examples, a leakage detection component 201 may include a storage element (e.g., a temporary storage element, a latch, a capacitor, a storage element) that stores an indication of whether leakage was detected (e.g., during an access operation). In some examples, a stored indication may be maintained or otherwise valid for a most-recent access operation, and may or may not be cleared or reset in response to another access being performed. An indication of whether leakage was detected may be received or requested by a memory controller 170, and a memory controller 170 or some other portion of a memory device 100 may subsequently use such an indication to support various examples of erasure decoding in accordance with techniques as disclosed herein.

FIG. 3 illustrates a plot 300 including distributions of a read characteristic associated with different information states that support erasure decoding for a memory device in accordance with examples as disclosed herein. The plot 300 may be illustrative of various read characteristics (e.g., read signals) when accessing a representative population of memory cells 105 of a memory device 100 with respect to a standard deviation, sigma, or some other probabilistic measure. For example, the illustrated read characteristic may refer to read voltage, read current, detected resistance, threshold voltage, or other types of read signals generated based on accessing memory cells 105 (e.g., capacitive memory cells, ferroelectric memory cells, material memory cells) written with a respective information state. For illustration purposes, the sigma axis may be a nonlinear axis so that a normal distribution of read characteristics may be illustrated as linear distributions in the plot 300. In some examples, the distributions of the plot 300 may be referred to as Gaussian distributions.

The distribution 310 may illustrate a first distribution of the read characteristic when storing a first information state (e.g., a first logic state, a first material state, a logic 0). In some examples, the distribution 310 may illustrate a distribution of voltages at a signal line 260 when reading memory cells 105 (e.g., capacitors 220) that were written with a logic 0. The distribution 310 may be associated with a lower boundary or edge (e.g., edge 311), which may be referred to as "E1," and an upper boundary or edge (e.g., edge 312), which may be referred to as "E2." The distribution 310 may illustrate various interpretations of a statistical distribution, such as a span of six standard deviations (e.g., six sigma), a span of twelve standard deviations (e.g., twelve sigma), or a span between a minimum and maximum level of the read characteristic of the representative population of memory cells 105 when written with a logic 0.

The distribution 320 may illustrate a second distribution of the read characteristic when storing a second information state (e.g., a second logic state, a second material state, a logic 1). In some examples, the distribution 320 may illustrate a distribution of voltages at a signal line 260 when reading memory cells 105 (e.g., capacitors 220) that were written with a logic 1. The distribution 320 may be associated with a lower boundary or edge (e.g., edge 321), which may be referred to as "E3," and an upper boundary or edge (e.g., edge 322), which may be referred to as "E4." The distribution 320 may illustrate various interpretations of a statistical distribution, such as a span of six standard deviations (e.g., six sigma), a span of twelve standard deviations (e.g., twelve sigma), or a span between a minimum and maximum of the read characteristic of the representative population of memory cells 105 when written with a logic 1.

In some examples, a memory device 100 may compare a read characteristic to a threshold to evaluate whether a memory cell 105 stores one information state or another. For example, when the illustrated read characteristic refers to a voltage of a signal line 260, a memory device 100 may include a reference component 285 that biases a reference line 265 with a reference voltage (e.g., a voltage demarcation) that is between the distribution 310 and the distribution 320 (e.g., between the edge 312 and the edge 321) to distinguish between a logic 0 and a logic 1. When a voltage of a signal line 260 (e.g., a voltage of a first node 291) based on accessing a memory cell 105 is below the reference voltage (e.g., a voltage of a second node 292), the memory device 100 may determine that the memory cell 105 stored a logic 0, and when a voltage of a signal line 260 based on accessing a memory cell 105 is above the reference voltage, the memory device 100 may determine that the memory cell 105 stored a logic 1. Read margins in such a scenario may include an E2 margin, associated with a difference between the reference voltage and edge 312, and an E3 margin, associated with a difference between the reference voltage and edge 321.

In some cases, however, a read characteristic when accessing a memory cell 105 may not behave according to the distributions 310 and 320. For example, in the presence of charge leakage, a voltage of the signal line 260 based on accessing a memory cell 105 may be lower than expected. Such leakage may, in some cases, cause a read voltage of a memory cell 105 written with a logic 1 to fall below a reference voltage, such that the memory cell 105 is incorrectly determined as being written with a logic 0 (e.g., illustrating a reduction or elimination of an E3 margin). Thus, according to these and other examples, leakage conditions may be associated with an indeterminate or uncertain logic state, or other reduction or elimination of a read margin. In some examples, a leakage detection component 201, such as those described with reference to FIG. 2, may be used in a circuit to identify memory cells 105 or access lines (e.g., signal lines 260, digit lines 210) that may be associated with a potentially indeterminate or uncertain logic state (e.g., an increased likelihood that a read operation will detect a logic 0).

In another example of techniques that may support identifying conditions associated with an erasure or otherwise indeterminate or uncertain information state, a memory device 100 may include multiple thresholds of a read characteristic to be applied during access operations. For example, plot 300 illustrates an information state mapping 340 that includes two read thresholds distinguishing read characteristic conditions for three information states. A first read threshold 330-*a* (e.g., $T_{read,0}$) may be associated with a logic 0, and a second read threshold 330-*b* (e.g., $T_{read,1}$) may be associated with a logic 1. In an example where the read characteristic refers to a read voltage, $T_{read,0}$ may be a reference voltage associated with a logic 0 (e.g., a first information state, a determinate information state) and $T_{read,1}$ may be a reference voltage associated with a logic 1 (e.g., a first information state, a determinate information state). In various examples, multiple reference voltages may be supported by a memory device 100 including multiple reference components 285, including multiple reference lines 265 (e.g., multiple second nodes 292 at a sense amplifier 290), or applying different voltages to a reference line 265 during different time intervals. In other examples, $T_{read,0}$ and $T_{read,1}$ may refer to respective reference read currents, respective reference charge transfers, respective reference resistances, respective threshold voltages (e.g., of a material memory element), or other read characteristic thresholds.

According to the information state mapping 340, when a read characteristic associated with accessing a memory cell 105 is below the first read threshold 330-*a* (or equal to or below the first read threshold 330-*a*), the read operation may identify or indicate a logic 0 for the memory cell 105 (e.g., as a determinate logic state). When a read characteristic associated with accessing a memory cell 105 is above the second read threshold 330-*b* (or equal to or above the second read threshold 330-*b*), the read operation may identify or indicate a logic 1 for the memory cell 105 (e.g., as a determinate logic state). However, when a read characteristic associated with accessing a memory cell 105 is between the first read threshold 330-*a* and the second read threshold 330-*b* (or equal to or between the first read threshold 330-*a* and the second read threshold, 330-*b*), the read operation may identify or indicate a logic X for the memory cell 105 (e.g., as an indeterminate logic state, as a null logic state, as a third information state). In other words, a region between the first read threshold 330-*a* and the second read threshold 330-*b* may illustrate a range of uncertainty, which may support an identification or indication separate from determinate logic states, or may refer to conditions associated with an absence of an identification or indication of an information state (e.g., a null information state, an unassigned information state).

In some examples, a memory device 100 may use the information state mapping 340 to enhance aspects of error handling at a memory device. For example, when identifying a memory cell 105 as being associated with a range of uncertainty of a read characteristic, such as a logic X or other null or unassigned information state, the memory device may employ techniques for assuming one or more information states in an associated codeword when performing error detection and error correction operations. Such techniques may be beneficial over other techniques, such as error handling techniques that do not identify a location for memory cells 105, or corresponding information positions of an associated codeword, that may include an error or have an elevated likelihood for error.

Although some examples of erasure or otherwise indeterminate logic state may be related to charge leakage, the described techniques may be additionally or alternatively applied in other scenarios. For example, some memory cells 105 may experience other types of degradation, such as a material migration that degrades a stored logic state, a degradation that impairs an ability to be written with a target logic state, or a degradation that impairs an ability to generate a read signal in response to a read operation. In various examples, two or more read thresholds 330 may be used to distinguish between determinate and indeterminate information states, or otherwise scale a weight or confidence in a detected information state. Memory cells 105, access lines (e.g., digit lines 210, signal lines 260), or information positions of a codeword having an indeterminate, unassigned, or relatively low confidence information state may be included in error handling operations that assign an assumed information state, or alternatives thereof, in an effort to identify a valid codeword (e.g., a codeword that properly represents information written to a set of memory cells 105).

Figure 4:
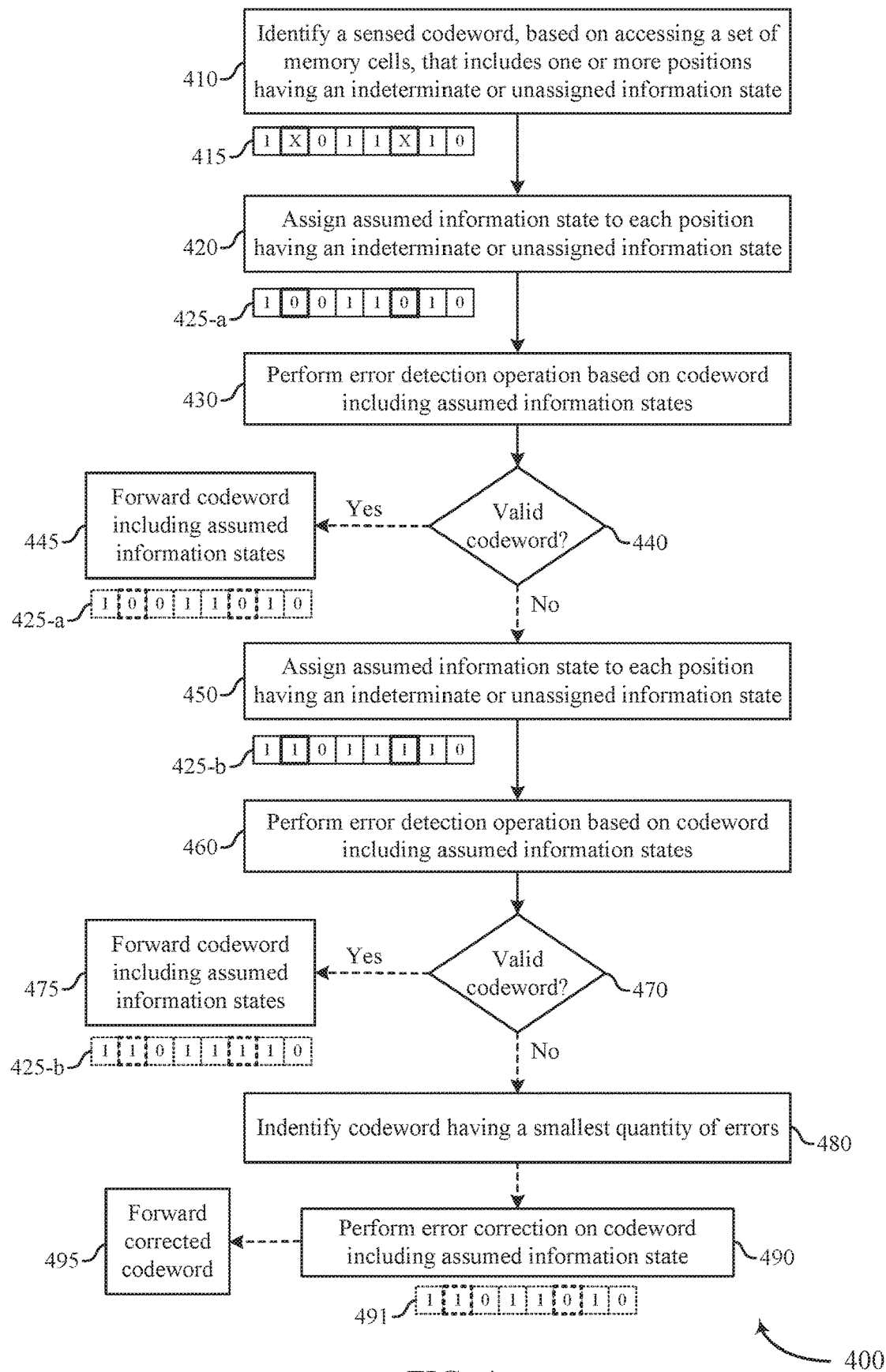
FIG. 4 illustrates an example of a method that supports erasure decoding for a memory device in accordance with examples as disclosed herein.

FIG. 4 illustrates an example of a method 400 that supports erasure decoding for a memory device in accordance with examples as disclosed herein. In some examples, the method 400 may be performed by a memory device, such as a memory device 100 described with reference to FIGS. 1 through 3. In some examples, one or more of the operations of method 400 may be performed by a host device coupled with such a memory device 100, such as a host device that performs error detection, error correction, or other error handling techniques for information retrieved from a memory device 100.

At 410, the method may include identifying a sensed codeword based on accessing a set of memory cells 105. In some examples, the set of memory cells 105 may include a row or page of memory cells 105, or some portion thereof. The codeword may have a set of information positions, and one or more of the set of information positions may be associated with an indeterminate or unassigned information state (e.g., an X logic state, a null logic state, an uncertain logic state). In some examples, the information positions associated with an indeterminate or unassigned information state may correspond to memory cells 105 or access lines (e.g., digit lines 210, signal lines 260) for which charge leakage was detected, or for which charge leakage was determined to be above or otherwise satisfy a threshold (e.g., using a leakage detection component 201 as described with reference to FIG. 2). In some examples, the information positions associated with an indeterminate information state may correspond to memory cells 105 for which an associated read characteristic (e.g., read signal) was determined to be between a first threshold corresponding to a first information state and a second threshold corresponding to a second information state (e.g., a read characteristic in an uncertainty region, a read characteristic between a first read threshold 330-a for a logic 0 and a second read threshold 330-b for a logic 1 as described with reference to FIG. 3).

In an example of the method 400, the operations of 410 may include identifying a sensed codeword 415 having a value of {1,X,0,1,1,X,1,0}, as shown. The example of sensed codeword 415 may illustrate a codeword having a set of eight information positions, with a second information position and a sixth information position each being associated with an indeterminate or unassigned information state (e.g., an "X" logic state, an uncertain logic state, a null logic state). In other examples in accordance with the described techniques, a sensed codeword may have more or fewer than eight information positions, and a given sensed codeword may have any quantity of zero or more information positions being associated with an indeterminate or unassigned logic state.

In some examples, identifying a sensed codeword at 410 may be accompanied by identifying parity information corresponding to the sensed codeword, such as one or more parity bits associated with the accessed memory cells 105 that may support subsequent error handling operations (e.g., error detection, error correction). In various examples, such parity information may be stored in a same row or memory section 110 as the memory cells 105 corresponding to the sensed codeword, or such parity information may be retrieved from elsewhere in a memory system, such as another portion of a memory device 100 (e.g., a portion of a memory device 100 allocated to parity information), or from another memory device 100 (e.g., when a host device stores information in a first memory device 100 and stores corresponding parity information in a second memory device 100)

At 420, the method 400 may include assigning a respective assumed (e.g., speculative) information state to each position having an indeterminate or unassigned information state. The assignment of 420 may be performed according to various techniques for assigning information states to one or more codewords (e.g., speculative codewords, hypothetical codewords, assumed codewords) for performing subsequent error detection operations (e.g., to evaluate a validity of the assumed information states or assumed codewords).

Continuing with the example of sensed codeword 415 having a value of {1,X,0,1,1,X,1,0}, at 420, the method 400 may include assigning each position of the sensed codeword 415 having a logic X with a logic 0, thereby generating a speculative codeword 425-a having a value of {1,0,0,1,1,0, 1,0}. In various other examples, the assignment at 420 may include assigning each position having a logic X with a logic 1 or some other assumed or speculative information state, or assigning a pattern of assumed information states such as assigning alternating positions having a logic X with a logic 0 or a logic 1.

In some examples, the operations of 420 may be performed based at least in part on a quantity of positions of the sensed codeword 415 having an indeterminate or unassigned information state satisfying a threshold. For example, the operations of 420 may be performed when a quantity of positions having an indeterminate or unassigned information state is less than a threshold, or less than or equal to a threshold, where such a threshold may be equal to or otherwise based at least in part on a minimum distance or "hamming distance" of an error correction code or other error handling capability.

At 430, the method 400 may include performing an error detection operation based on the codeword including assumed information states (e.g., speculative codeword 425-a, as generated at 420). The error detection operations of 430 may be performed according various techniques for identifying a presence or quantity of errors in the speculative codeword 425-a, For example, the speculative codeword 425-a may be run through an ECC engine where an output is a bus or string that may be referred to as a syndrome. In some examples, when the syndrome contains all logic zeros, the speculative codeword 425-a may be identified as being valid (e.g., matching or otherwise agreeing with information as written to the accessed set of memory cells 105). In some examples, the error detection operations of 430 may include parity checking (e.g., based at least in part on parity information associated with the sensed codeword 415), and if all the parity bits based on processing the speculative codeword 425-a are zero, or otherwise match or agree with the parity information associated with the sensed codeword 415 (e.g., of the accessed set of memory cells 105) the speculative codeword 425-a may be identified as being valid.

At 440, the method 400 may include determining whether the codeword including assumed information states is valid (e.g., based at least in part on the error detection operation of 430). For example, if a syndrome of the error detection operations of 430, as performed on a speculative codeword 425-a, contains all zeros, or if parity information based on processing the speculative codeword 425-a otherwise matches the parity information associated with the sensed code-word 415, the method 400 may proceed to 445 and forward the codeword including the assumed information states (e.g., as assigned at 420). In a first example referring to the speculative codeword 425-a having a value of {1,0, 0,1,1,0,1,0}, if, at 440, the speculative codeword 425-a is identified as being valid, the method may include, at 445, forwarding the speculative codeword 425-a having the value of {1,0,0,1,1,0,1,0}. If, at 440, speculative codeword 425-a is determined to be invalid, the method 400 may proceed to 450.

At 450, the method 400 may include assigning a respective assumed information state to each position having an indeterminate or unassigned information state, which may be different than the assumed information states assigned at 420. In some examples, the respective assumed information state assigned to each position at 450 may be an opposite of or complement to the respective assumed information state assigned to the corresponding position at 420.

Continuing with the example of sensed codeword 415 having a value of {1,X,0,1,1,X,1,0}, at 450, the method 400 may include assigning each position of the sensed codeword 415 having a logic X with a logic 1, thereby generating a speculative codeword 425-b having a value of {1,1,0,1,1,1, 1,0}. In various other examples, the assignment at 450 may include assigning each position having a logic X with a logic 1 or some other assumed or speculative information state, or assigning a pattern of assumed information states such as assigning alternating positions having a logic X with a logic 1 or a logic 0.

At 460, the method 400 may include performing an error detection operation based on the codeword including assumed information states (e.g., speculative codeword 425-b as generated at 450). The error detection operations of 460 may be performed according various techniques for identifying a presence or quantity of errors in the speculative codeword 425-b, which may be the same as, similar to, or different than the error detection operations of 430.

At 470, the method 400 may include determining whether the codeword including assumed information states is valid (e.g., based at least in part on the error detection operation of 460). For example, if a syndrome of the error detection operations of 460, as performed on a speculative codeword 425-b, contains all zeros, or if parity information based on processing the speculative codeword 425-b otherwise matches the parity information associated with the sensed codeword 415, the method 400 may proceed to 475 and forward the codeword including the assumed information states (e.g., as assigned at 450). In a first example referring to the speculative codeword 425-b having a value of {1,1, 0,1,1,1,1,0}, if, at 470, the speculative codeword 425-b is identified as being valid, the method may include, at 475, forwarding the speculative codeword 425-b having the value of {1,1,0,1,1,1,1,0}. If, at 470, speculative codeword 425-b is determined to be invalid, the method 400 may proceed to 480.

At 480, the method 400 may include identifying a codeword (e.g., speculative codeword 425) having a smallest quantity of errors. For example, the first speculative codeword 425-a may be associated with a first quantity of errors, and the second speculative codeword 425-b may be associated with a second quantity of errors. When the first quantity of errors is different than the second quantity of errors, the method 400 may include identifying the speculative codeword 425 associated with the smaller of the first quantity of errors and the second quantity of errors. When the first quantity of errors is equal to the second quantity of errors, the method 400 may include identifying either or both of the speculative codewords. In some examples, the method 400 may include a default for identifying the first speculative codeword 425-a or the second speculative codeword 425-b (e.g., when the respective quantities of errors are equal).

At 490, the method 400 may include performing an error correction operation on the codeword including assumed information states (e.g., on a speculative codeword 425, as identified at 480). In some examples, the error correction of 490 may include processing a speculative codeword 425 along with syndrome information (e.g., as generated at 430 or 460) to generate a corrected codeword. In some examples, the error correction operation may identify error positions of an incoming codeword and flip bits or otherwise alter information states in those identified error positions. At 490, the method 400 may also include generating a corrected codeword 491 to be forwarded at 495.

Continuing with the second example referring to the speculative codeword 425-b, having a value of {1,1,0,1,1, 1,1,0}, being identified and forwarded at 480 (e.g., an example of the speculative codeword 425-b being invalid with a single error), at 490, the method 400 may include identifying that the speculative codeword 425-b has an error in the sixth position, and the method 400 may include generating a corrected codeword 491 having a value of {1,1,0,1,1,0,1,0}. The method 400 may accordingly proceed to 495 where the corrected codeword 491 may be forwarded.

The forwarding at 445, 475, or 495 may include a forwarding to various components of a memory system. In some examples, the forwarding may include forwarding the speculative codeword or corrected codeword from an ECC engine of a memory device 100 to an input/output component of the memory device 100 (e.g., for output to a host device coupled with the memory device 100). Additionally or alternatively, the forwarding of may include forwarding a speculative codeword or corrected codeword from an ECC engine of a memory device 100 to a write component of the memory device 100 (e.g., for use within the memory device 100), such as a rewrite or write-back component, a wear leveling component, an information reallocation component, or some other memory management component of a memory device 100. In some examples, the forwarding of may include forwarding a speculative codeword or a corrected codeword from an ECC engine of a host device coupled with a memory device 100 to a processing component of the host device (e.g., for processing information retrieved from a memory device 100). In some examples, a forwarding at 445, 475, or 495 may be accompanied by other operations, such as a diagnostic signaling that an erasure correction or error correction was performed or required, which may support additional diagnostic operations of a memory device 100 or host device coupled with the memory device 100 (e.g., initiating leakage detection operations, initiating a remapping of memory addresses, signaling an error condition or potential error condition)

Although the operations of method 400 are described in the context of a serial approach (e.g., generating and processing a first speculative codeword 425-*a* prior to generating a second speculative codeword 425-*b*, if necessary), in some examples, operations of method 400 may be performed in a parallel approach. For example, the method 400 may be modified to concurrently generate two or more speculative codewords 425 for parallel processing, such as concurrently performing the operations of 420 and 450, or concurrently performing the operations of 430 and 460 (e.g., concurrently generating and processing the first speculative codeword 425-*a* and the second speculative codeword 425-*b*). In some examples, such techniques may be performed using parallel error detection processing supported by two or more ECC engines, or portions thereof (e.g., an ECC engine with two or more error detection components feeding a single error correction component). In some examples, two or more speculative codewords 425 may be generated before determining whether any of the speculative codewords 250 are valid, or before determining which of the two or more speculative codewords 425 are to be forwarded for error correction operations (e.g., forwarding a speculative codeword 425 having the lowest quantity of errors).

Although the method 400 is described with an example having two information positions being associated with an indeterminate information state (e.g., erasures), and no other errors (e.g., at information positions other than those identified with an indeterminate information state), the described techniques for erasure decoding may support the correction of various other combinations of errors and erasures. For example, the method may, at 490, identify and correct an error unrelated to the indeterminate information states (e.g., at the first, third, fourth, fifth, seventh, or eighth information position). Moreover, the described techniques for erasure decoding may be applied to various capabilities of an ECC engine, including support for various quantities of errors that may be detected, or support for various quantities of errors that may be corrected.

For example, a minimum distance of an error correction code, $d_{min}$, between a given codeword (e.g., sensed codeword 415) and a valid codeword may be given by the following:

$$d_{min} \geq 2t+s+1 \quad (1)$$

where t may be equal to a quantity of errors (e.g., for which a location is unknown) and s may be equal to a quantity of erasures (e.g., known information positions for which an information state may be indeterminate). Examples of error handling in accordance with the illustrative relationship of Equation 1 are given below in Table 1, indicating how error handling may be enhanced when applying the described techniques for erasure decoding with a given error correction capability and error detection capability (e.g., where ECC1 may refer to single-hit error correction capability and ECC2 may refer to double-bit error correction capability).

TABLE 1

| Error handling possibilities using erasure decoding | | | |
|---|---|---|---|
| Type of Code | dmin | Max Correctible | 2t + s + 1 |
| ECC1, single bit error detection | 3 | 1 error | 3 |
|  |  | 2 erasures | 3 |
| ECC1, two bit error detection | 4 | 1 error and 1 erasure | 4 |
|  |  | 3 erasures | 4 |

TABLE 1-continued

| Error handling possibilities using erasure decoding | | | |
|---|---|---|---|
| Type of Code | dmin | Max Correctible | 2t + s + 1 |
| ECC2, two bit error detection | 5 | 2 errors | 5 |
|  |  | 1 error and 2 erasures | 5 |
|  |  | 4 erasures | 5 |
| ECC2, three bit error detection | 6 | 2 errors and 1 erasure | 6 |
|  |  | 1 error and 3 erasures | 6 |
|  |  | 5 erasures | 6 |

Thus, according to these and other examples, the described techniques for erasure decoding may support an error correction capability that is greater than what might otherwise be supported by an error handling code when information locations associated with errors are unknown. For example, leakage detection or other techniques may be used to identify a type of erasure condition where an information state may have an unknown value at known locations and, using such an identification, three of these erasures may be corrected for using a 1-bit error corrector and a 2-bit error detector (e.g., as supported by two-bit parity information for each sensed codeword).

The described techniques for erasure decoding may have additional advantages. For example, since the correction of data occurs during decoding (e.g., as opposed to encoding), bit-flipping may be advantageously employed for fatigue management in a memory array. Moreover, since the recovery of valid data happens during decoding, up to 3 erasure failures can be handled (e.g., using two bit error detection and single bit error correction) without up-front knowledge of the valid data.

Figure 5:
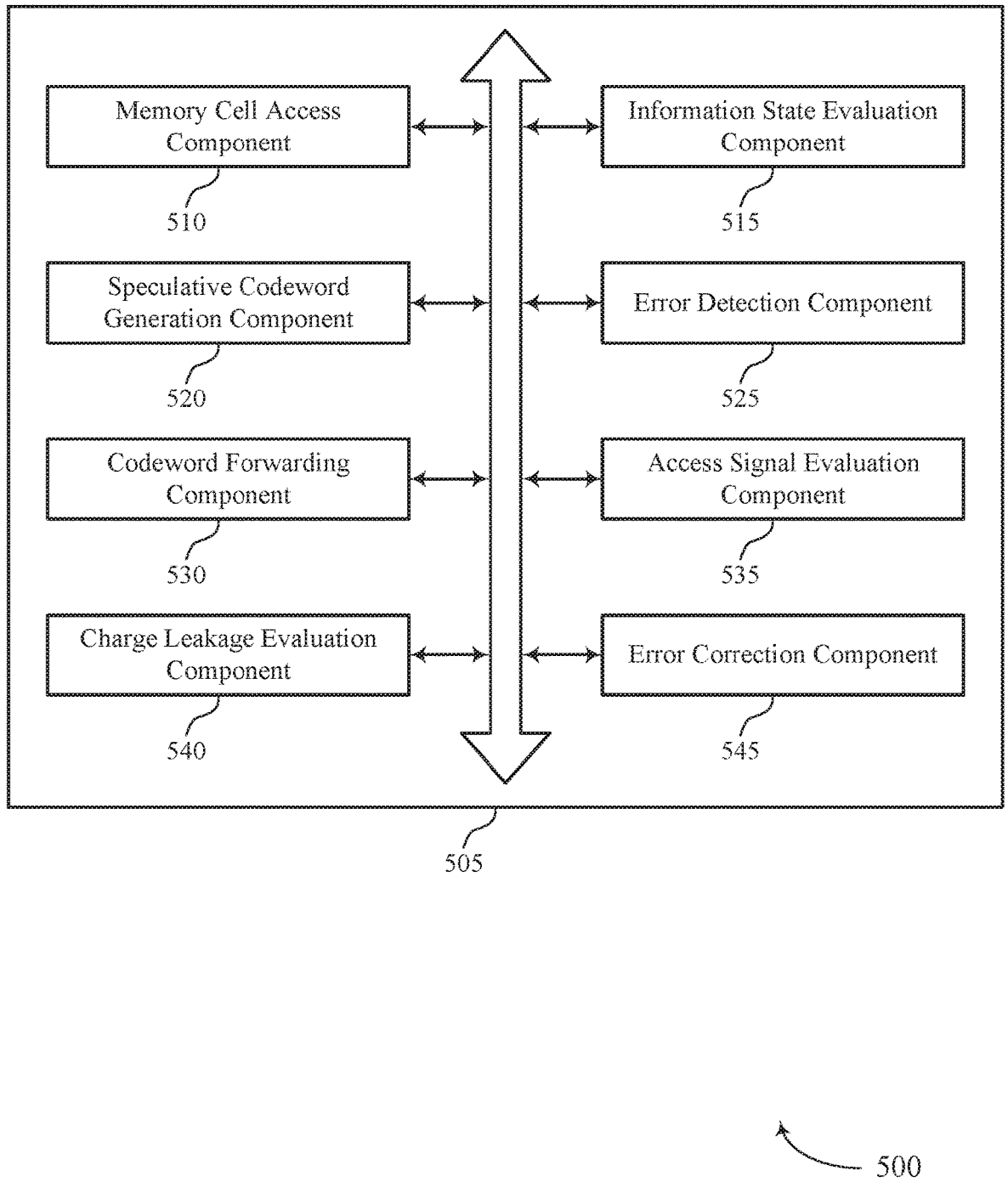
FIG. 5 shows a block diagram of a memory device that supports erasure decoding for a memory device in accordance with aspects of the present disclosure.

FIG. 5 shows a block diagram 500 of a memory device 505 that supports erasure decoding for a memory device in accordance with examples as disclosed herein. The memory device 505 may be an example of aspects of a memory device as described with reference to FIGS. 1 through 4. The memory device 505 may include a memory cell access component 510, an information state evaluation component 515, a speculative codeword generation component 520, an error detection component 525, a codeword forwarding component 530, an access signal evaluation component 535, a charge leakage evaluation component 540, and an error correction component 545. Each of these modules may communicate, directly or indirectly, with one another (e.g., via one or more buses).

The memory cell access component 510 may access a set of memory cells of the memory device.

The information state evaluation component 515 may determine, based on accessing the set of memory cells, that one or more memory cells of the set of memory cells is associated with an indeterminate or uncertain information state.

The speculative codeword generation component 520 may generate a first codeword (e.g., a speculative codeword) including a set of information positions, each information position of the set of information positions corresponding to a respective memory cell of the set of memory cells, where the generating includes assigning a respective assumed or speculative information state to each information position corresponding to a memory cell of the one or more memory cells.

In some examples, the speculative codeword generation component 520 may generate a third codeword based on assigning a respective second assumed information state to one or more of the information positions corresponding to a memory cell of the one or more memory cells.

In some examples, the speculative codeword generation component 520 may generate a fourth codeword based on assigning a respective third assumed information state one or more of the information positions corresponding to a memory cell of the one or more memory cells.

The error detection component 525 may perform an error detection operation based on the first codeword (e.g., a speculative codeword). In various examples, an error detection operation performed by the error detection component 525 may indicate that the first codeword is valid or invalid.

In some examples, the error detection component 525 may perform a second error detection operation based on a third codeword (e.g., a speculative codeword). In various examples, an error detection operation performed by the error detection component 525 may indicate that the third codeword is valid or invalid.

In some examples, the error detection component 525 may perform a third error detection operation based on the fourth codeword (e.g., a speculative codeword). In various examples, an error detection operation performed by the error detection component 525 may indicate that the fourth codeword is valid or invalid.

The codeword forwarding component 530 may forward a second codeword based on performing the error detection operation. In some examples, forwarding the second codeword includes forwarding the second codeword having the same information as the first codeword at each information position of the second codeword (e.g., a same codeword as a speculative codeword). In some examples, the codeword forwarding component 530 may forward the second codeword (e.g., a corrected codeword) based on performing the second error detection operation.

In some examples, forward the second codeword includes forwarding the second codeword having the same information as the third codeword at each information position of the second codeword (e.g., a same codeword as a speculative codeword). In some examples, the codeword forwarding component 530 may forward the second codeword (e.g., a corrected codeword) based on performing the third error detection operation.

In some examples, to determine that the one or more memory cells is associated with an indeterminate information state, the access signal evaluation component 535 may determine, for each of the one or more memory cells, that a signal based on accessing the respective memory cell is between a first threshold associated with a first logic state and a second threshold associated with a second logic state.

In some examples, to determine that the one or more memory cells is associated with an indeterminate information state, the access signal evaluation component 535 may determine that an access line coupled with the respective memory cell has a voltage based on accessing the respective memory cell that is between a first threshold voltage and a second threshold voltage.

In some examples, to determine that the one or more memory cells is associated with an indeterminate information state, the access signal evaluation component 535 may determine that a current, based on accessing the respective memory cell, is between a first threshold current and a second threshold current.

In some examples, to determine that the one or more memory cells is associated with an indeterminate information state, the charge leakage evaluation component 540 may determine, for each of the one or more memory cells, that a charge leakage of the respective memory cell satisfies a threshold.

In some examples, to determine that the one or more memory cells is associated with an indeterminate information state, the charge leakage evaluation component 540 may determine, for each of the one or more memory cells, that a charge leakage associated with an access line coupled to the respective memory cell satisfies a threshold.

In some examples, the error correction component 545 may generate the second codeword (e.g., a corrected codeword) based on assigning an information state that is different than the first codeword to one or more information positions of the second codeword.

In some examples, the error correction component 545 may generate the second codeword (e.g., a corrected codeword) based on assigning an information state that is different than the third codeword to one or more information positions of the second codeword.

Figure 6:
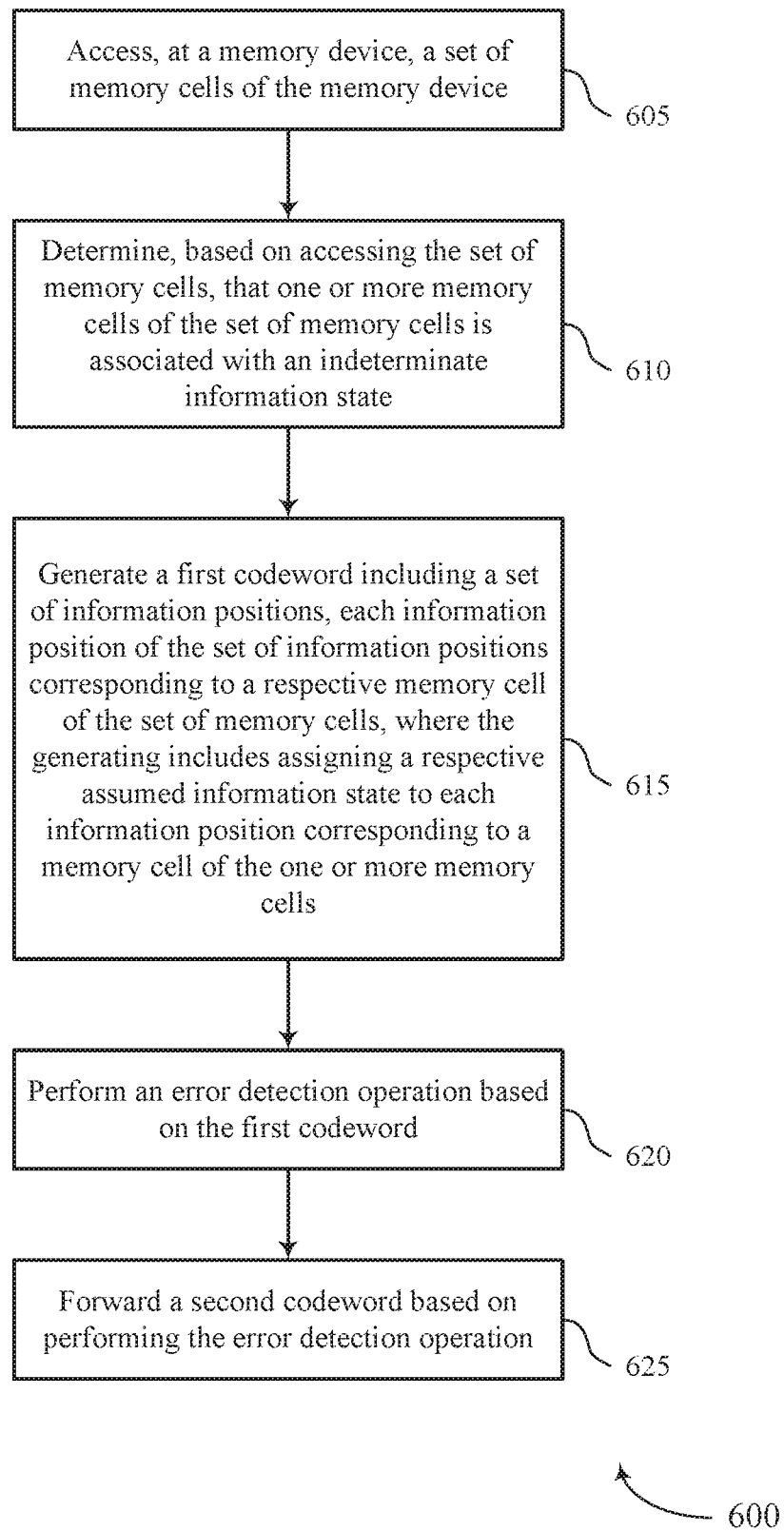
FIG. 6 shows a flowchart illustrating a method or methods that support erasure decoding for a memory device in accordance with examples as disclosed herein.

FIG. 6 shows a flowchart illustrating a method or methods 600 that supports erasure decoding for a memory device in accordance with aspects of the present disclosure. The operations of method 600 may be implemented by a memory device or its components as described herein. For example, the operations of method 600 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose circuitry or hardware.

At 605, the memory device may access a set of memory cells of the memory device. The operations of 605 may be performed according to the methods described herein. In some examples, aspects of the operations of 605 may be performed by a memory cell access component as described with reference to FIG. 5.

At 610, the memory device may determine, based on accessing the set of memory cells, that one or more memory cells of the set of memory cells is associated with an indeterminate information state. The operations of 610 may be performed according to the methods described herein. In some examples, aspects of the operations of 610 may be performed by an information state evaluation component as described with reference to FIG. 5.

At 615, the memory device may generate a first codeword including a set of information positions, each information position of the set of information positions corresponding to a respective memory cell of the set of memory cells. In some examples, generating the first codeword may include assigning a respective assumed information state to each information position corresponding to a memory cell of the one or more memory cells. The operations of 615 may be performed according to the methods described herein. In some examples, aspects of the operations of 615 may be performed by a speculative codeword generation component as described with reference to FIG. 5.

At 620, the memory device may perform an error detection operation based on the first codeword. The operations of 620 may be performed according to the methods described herein. In some examples, aspects of the operations of 620 may be performed by an error detection component as described with reference to FIG. 5.

At 625, the memory device may forward a second codeword based on performing the error detection operation. The operations of 625 may be performed according to the methods described herein. In some examples, aspects of the operations of 625 may be performed by a codeword forwarding component as described with reference to FIG. 5.

In some examples, an apparatus as described herein may perform a method or methods, such as the method 600. The apparatus may include features, circuitry, means, or instructions (e.g., a non-transitory computer-readable medium storing instructions executable by a processor) for accessing, at a memory device, a set of memory cells of the memory device, determining, based on accessing the set of memory cells, that one or more memory cells of the set of memory cells is associated with an indeterminate information state, generating a first codeword including a set of information positions, each information position of the set of information positions corresponding to a respective memory cell of the set of memory cells, where the generating includes assigning a respective assumed information state to each information position corresponding to a memory cell of the one or more memory cells, performing an error detection operation based on the first codeword, and forwarding a second codeword based on performing the error detection operation.

In some examples of the method 600 and the apparatus described herein, determining that the one or more memory cells may be associated with an indeterminate information state may include operations, features, circuitry, means, or instructions for determining, for each of the one or more memory cells, that a signal based on accessing the respective memory cell is between a first threshold associated with a first logic state and a second threshold associated with a second logic state.

In some examples of the method 600 and the apparatus described herein, determining that the signal based on accessing the respective memory cell is between the first threshold and the second threshold may include operations, features, circuitry, means, or instructions for determining that an access line coupled with the respective memory cell has a voltage based on accessing the respective memory cell that is between a first threshold voltage and a second threshold voltage.

In some examples of the method 600 and the apparatus described herein, determining that the signal based on accessing the respective memory cell is between the first threshold and the second threshold may include operations, features, circuitry, means, or instructions for determining that a current, based on accessing the respective memory cell, is between a first threshold current and a second threshold current.

In some examples of the method 600 and the apparatus described herein, determining that the one or more memory cells is associated with an indeterminate information state may include operations, features, circuitry, means, or instructions for determining, for each of the one or more memory cells, that a charge leakage of the respective memory cell satisfies a threshold.

In some examples of the method 600 and the apparatus described herein, determining that the one or more memory cells is associated with an indeterminate information state may include operations, features, circuitry, means, or instructions for determining, for each of the one or more memory cells, that a charge leakage associated with an access line coupled to the respective memory cell satisfies a threshold.

In some examples of the method 600 and the apparatus described herein, performing the error detection operation may indicate that the first codeword is valid, and forwarding the second codeword may include operations, features, circuitry, means, or instructions for forwarding the second codeword having the same information as the first codeword at each information position of the second codeword.

In some examples of the method 600 and the apparatus described herein, performing the error detection operation may indicate that the first codeword is invalid and within an error correction capability of the memory device, and the method 600 or the apparatus described herein may further include operations, features, circuitry, means, or instructions for generating the second codeword based on assigning an information state that may be different than the first codeword to one or more information positions of the second codeword.

In some examples of the method 600 and the apparatus described herein, performing the error detection operation may indicate that the first codeword is invalid and beyond an error correction capability of the memory device, and the method 600 and the apparatus described herein may further include operations, features, circuitry, means, or instructions for generating a third codeword based on assigning a respective second assumed information state to one or more of the information positions corresponding to a memory cell of the one or more memory cells, performing a second error detection operation based on the third codeword, and forwarding the second codeword based on performing the second error detection operation.

In some examples of the method 600 and the apparatus described herein performing the second error detection operation may indicate that the third codeword is valid, and forwarding the second codeword may include operations, features, circuitry, means, or instructions for forwarding the second codeword having the same information as the third codeword at each information position of the second codeword.

In some examples of the method 600 and the apparatus described herein, performing the second error detection operation may indicate that the first codeword is invalid and within an error correction capability of the memory device, and the method 600 or the apparatus described herein may further include operations, features, circuitry, means, or instructions for generating the second codeword based on assigning an information state that is different than the third codeword to one or more information positions of the second codeword.

In some examples of the method 600 and the apparatus described herein, performing the second error detection operation may indicate that the first codeword is invalid and beyond an error correction capability of the memory device, and the method 600 or the apparatus described herein may further include operations, features, circuitry, means, or instructions for generating a fourth codeword based on assigning a respective third assumed information state one or more of the information positions corresponding to a memory cell of the one or more memory cells, performing a third error detection operation based on the fourth codeword, and forwarding the second codeword based on performing the third error detection operation.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a memory array including a set of memory cells, an access component coupled with the memory array and configured to generate a first codeword based on accessing the set of memory cells, a leakage detection component coupled with the memory array and configured to determine that a charge leakage associated with one or more memory cells of the set of memory cells satisfies a threshold, an error detection component coupled with the access component and the leakage detection component and configured to perform one or more error detection operations based on assigning a respective assumed information state to each information position of the first codeword corresponding to the one or more memory cells, and an input/output component configured to forward a second codeword based on performing the one or more error detection operations.

In some examples, the error detection component may be configured to perform a first error detection operation on a third codeword that is based on assigning a respective first assumed information state to each information position of the first codeword corresponding to the one or more memory cells, and perform a second error detection operation on a fourth codeword that is based on assigning a respective second assumed information state to each information position of the first codeword corresponding to the one or more memory cells.

In some examples, the error detection component may be configured to perform the first error detection operation concurrently with the second error detection operation.

In some examples, the error detection component may be configured to select one of the third codeword or the fourth codeword based on a quantity of detected errors of the first error detection operation and a quantity of detected errors of the second error detection operation, and forward the selected codeword.

In some examples, the error detection component may be configured to select the third codeword when the quantity of detected errors of the first error detection operation is less than the quantity of detected errors of the second error detection operation, and select the fourth codeword when the quantity of detected errors of the second error detection operation is less than the quantity of detected errors of the first error detection operation.

In some examples, the error detection component may be configured to forward the selected codeword to an error correction component when a quantity of errors corresponding to the selected codeword is within an error correction capability of the error correction component.

In some examples, the error detection component may be configured to forward the selected codeword to the input/output component when a quantity of errors corresponding to the selected codeword is zero.

An apparatus is described. The apparatus may include a memory array including a set of memory cells and a controller coupled with the memory array. The controller may be configured to access the set of memory cells, determine, based on accessing the set of memory cells, that one or more memory cells of the set of memory cells is associated with an indeterminate information state, generate a first codeword including a set of information positions, each information position of the set of information positions corresponding to a respective memory cell of the set of memory cells, where the generating includes assigning a respective assumed information state to each information position corresponding to a memory cell of the one or more memory cells, perform an error detection operation based on the first codeword, and forward a second codeword based on performing the error detection operation.

In some examples, to determine that the one or more memory cells is associated with an indeterminate information state, the controller may be configured to determine, for each of the one or more memory cells, that a charge leakage of the respective memory cell satisfies a threshold.

In some examples, to determine that the one or more memory cells is associated with an indeterminate information state, the controller may be configured to determine, for each of the one or more memory cells, that a charge leakage associated with an access line coupled to the respective memory cell satisfies a threshold.

In some examples, to determine that the one or more memory cells is associated with an indeterminate information state, the controller may be configured to determine, for each of the one or more memory cells, that a signal based on accessing the respective memory cell is between a first threshold associated with a first logic state and a second threshold associated with a second logic state.

In some examples, to determine that the signal based on accessing the respective memory cell is between the first threshold and the second threshold, the controller may be configured to determine that an access line coupled with the respective memory cell has a voltage based on accessing the respective memory cell that is between a first threshold voltage and a second threshold voltage.

In some examples, to determine that the signal based on accessing the respective memory cell is between the first threshold and the second threshold, the controller may be configured to determine that a current, based on accessing the respective memory cell, is between a first threshold current and a second threshold current.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOCK) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an ASIC, a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   accessing, at a memory device, a plurality of memory cells of the memory device;

determining, based at least in part on accessing the plurality of memory cells, that one or more memory cells of the plurality of memory cells is associated with an indeterminate information state;

generating a first codeword comprising a plurality of information positions, each information position of the plurality of information positions corresponding to a respective memory cell of the plurality of memory cells, wherein the generating comprises assigning a respective assumed information state to each information position corresponding to a memory cell of the one or more memory cells;

performing an error detection operation based at least in part on the first codeword; and forwarding a second codeword based at least in part on performing the error detection operation.

2. The method of claim 1, wherein determining that the one or more memory cells is associated with an indeterminate information state comprises:

determining, for each of the one or more memory cells, that a signal based at least in part on accessing the respective memory cell is between a first threshold associated with a first logic state and a second threshold associated with a second logic state.

3. The method of claim 2, wherein determining that the signal based at least in part on accessing the respective memory cell is between the first threshold and the second threshold comprises:

determining that an access line coupled with the respective memory cell has a voltage based at least in part on accessing the respective memory cell that is between a first threshold voltage and a second threshold voltage.

4. The method of claim 2, wherein determining that the signal based at least in part on accessing the respective memory cell is between the first threshold and the second threshold comprises:

determining that a current, based at least in part on accessing the respective memory cell, is between a first threshold current and a second threshold current.

5. The method of claim 1, wherein determining that the one or more memory cells is associated with an indeterminate information state comprises:

determining, for each of the one or more memory cells, that a charge leakage of the respective memory cell satisfies a threshold.

6. The method of claim 1, wherein determining that the one or more memory cells is associated with an indeterminate information state comprises:

determining, for each of the one or more memory cells, that a charge leakage associated with an access line coupled to the respective memory cell satisfies a threshold.

7. The method of claim 1, wherein:

performing the error detection operation indicates that the first codeword is valid; and forwarding the second codeword comprises forwarding the second codeword having the same information as the first codeword at each information position of the second codeword.

8. The method of claim 1, wherein performing the error detection operation indicates that the first codeword is invalid and within an error correction capability of the memory device, the method further comprising:

generating the second codeword based at least in part on assigning an information state that is different than the first codeword to one or more information positions of the second codeword.

9. The method of claim 1, wherein performing the error detection operation indicates that the first codeword is invalid and beyond an error correction capability of the memory device, the method further comprising:

generating a third codeword based at least in part on assigning a respective second assumed information state to one or more of the information positions corresponding to a memory cell of the one or more memory cells;

performing a second error detection operation based at least in part on the third codeword; and forwarding the second codeword based at least in part on performing the second error detection operation.

10. The method of claim 9, wherein:

performing the second error detection operation indicates that the third codeword is valid; and forwarding the second codeword comprises forwarding the second codeword having the same information as the third codeword at each information position of the second codeword.

11. The method of claim 9, wherein performing the second error detection operation indicates that the third codeword is invalid and within the error correction capability of the memory device, the method further comprising:

generating the second codeword based at least in part on assigning an information state that is different than the third codeword to one or more information positions of the second codeword.

12. The method of claim 9, wherein performing the error detection operation indicates that the third codeword is invalid and beyond the error correction capability of the memory device, the method further comprising:

generating a fourth codeword based at least in part on assigning a respective third assumed information state one or more of the information positions corresponding to a memory cell of the one or more memory cells;

performing a third error detection operation based at least in part on the fourth codeword; and forwarding the second codeword based at least to part on performing the third error detection operation.

13. An apparatus, comprising:

a memory array comprising a plurality of memory cells;

an access component coupled with the memory array and configured to generate a first codeword based at least in part on accessing the plurality of memory cells;

a leakage detection component coupled with the memory array and configured to determine that a charge leakage associated with one or more memory cells of the plurality of memory cells satisfies a threshold;

an error detection component coupled with the access component and the leakage detection component and configured to perform one or more error detection operations based at least in part on assigning a respective assumed information state to each information position of the first codeword corresponding to the one or more memory cells; and an input/output component configured to forward a second codeword based at least in part on performing the one or more error detection operations.

14. The apparatus of claim 13, wherein the error detection component is configured to:

perform a first error detection operation on a third codeword that is based at least in part on assigning a respective first assumed information state to each information position of the first codeword corresponding to the one or more memory cells; and perform a second error detection operation on a fourth codeword that is based at least in part on assigning a respective second assumed information state to each information position of the first codeword corresponding to the one or more memory cells.

15. The apparatus of claim 14, wherein the error detection component is configured to perform the first error detection operation concurrently with the second error detection operation.

16. The apparatus of claim 14, wherein the error detection component is configured to:
select one of the third codeword or the fourth codeword based at least in part on a quantity of detected errors of the first error detection operation and a quantity of detected errors of the second error detection operation; and
forward the selected codeword.

17. The apparatus of claim 16, wherein the error detection component is configured to:
select the third codeword when the quantity of detected errors of the first error detection operation is less than the quantity of detected errors of the second error detection operation; and
select the fourth codeword when the quantity of detected errors of the second error detection operation is less than the quantity of detected errors of the first error detection operation.

18. The apparatus of claim 16, wherein the error detection component is configured to forward the selected codeword to an error correction component when a quantity of errors corresponding to the selected codeword is within an error correction capability of the error correction component.

19. The apparatus of claim 16, wherein the error detection component is configured to forward the selected codeword to the input/output component when a quantity of errors corresponding to the selected codeword is zero.

20. An apparatus, comprising:
a memory array comprising a plurality of memory cells; and
a controller coupled with the memory array and configured to:
access the plurality of memory cells;
determine, based at least in part on accessing the plurality of memory cells, that one or more memory cells of the plurality of memory cells is associated with an indeterminate information state;
generate a first codeword comprising a plurality of information positions, each information position of the plurality of information positions corresponding to a respective memory cell of the plurality of memory cells, wherein the generating comprises assigning a respective assumed information state to each information position corresponding to a memory cell of the one or more memory cells;
perform an error detection operation based at least in part on the first codeword; and
forward a second codeword based at least in part on performing the error detection operation.

21. The apparatus of claim 20, wherein, to determine that the one or more memory cells is associated with an indeterminate information state, the controller is configured to:
determine, for each of the one or more memory cells, that a signal based at least in part on accessing the respective memory cell is between a first threshold associated with a first logic state and a second threshold associated with a second logic state.

22. The apparatus of claim 21, wherein, to determine that the signal based at least in part on accessing the respective memory cell is between the first threshold the second threshold, the controller is configured to:
determine that an access line coupled with the respective memory cell has a voltage based at least in part on accessing the respective memory cell that is between a first threshold voltage and a second threshold voltage.

23. The apparatus of claim 21, wherein, to determine that the signal based at least in part on accessing the respective memory cell is between the first threshold the second threshold, the controller is configured to:
determine that a current, based at least in part on accessing the respective memory cell, is between a first threshold current and a second threshold current.

24. The apparatus of claim 20, wherein, to determine that the one or more memory cells is associated with an indeterminate information state, the controller is configured to:
determine, for each of the one or more memory cells, that a charge leakage of the respective memory cell satisfies a threshold.

25. The apparatus of claim 20, wherein, to determine that the one or more memory cells is associated with an indeterminate information state, the controller is configured to:
determine, for each of the one or more memory cells, that a charge leakage associated with an access line coupled to the respective memory cell satisfies a threshold.

* * * * *